United States Patent
Suk et al.

(10) Patent No.: US 9,048,120 B2
(45) Date of Patent: Jun. 2, 2015

(54) INTEGRATED JUNCTION AND JUNCTIONLESS NANOTRANSISTORS

(71) Applicants: Sung-Dae Suk, Seoul (KR); Changwoo Oh, Suwon-si (KR); Sungil Park, Suwon-si (KR)

(72) Inventors: Sung-Dae Suk, Seoul (KR); Changwoo Oh, Suwon-si (KR); Sungil Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 3 days.

(21) Appl. No.: 14/088,650

(22) Filed: Nov. 25, 2013

(65) Prior Publication Data

US 2014/0145273 A1 May 29, 2014

(30) Foreign Application Priority Data

Nov. 26, 2012 (KR) ........................ 10-2012-0134593

(51) Int. Cl.
*H01L 31/119* (2006.01)
*H01L 27/088* (2006.01)
(Continued)

(52) U.S. Cl.
CPC .... *H01L 27/0883* (2013.01); *H01L 21/823412* (2013.01); *H01L 21/823431* (2013.01); *H01L 21/823807* (2013.01); *H01L 21/823821* (2013.01); *H01L 27/0886* (2013.01); *H01L 27/0924* (2013.01)

(58) Field of Classification Search
CPC .................. H01L 21/82341; H01L 21/823431; H01L 21/823807; H01L 21/823821; H01L 27/0886; H01L 27/0924; H01L 27/0883; H01L 21/823864; H01L 29/6656; H01L 29/6653

USPC .................................. 257/296, 365, 347, 288
See application file for complete search history.

(56) References Cited

U.S. PATENT DOCUMENTS 6,512,273 B1 * 1/2003 Krivokapic et al. .......... 257/369
6,734,509 B2 * 5/2004 Ohnakado et al. ............ 257/393
(Continued)

FOREIGN PATENT DOCUMENTS

JP 2008-028263 A 2/2008
KR 10-0531243 B1 11/2005
(Continued)

OTHER PUBLICATIONS

Choi et al, "Sensitivity of Threshold Voltage to Nanowire Width Variation in Junctionless Transistors", *IEEE Electron Device Letters*, vol. 32, No. 2, Feb. 2011, pp. 125-127.
(Continued)

*Primary Examiner* — Dung Le
(74) *Attorney, Agent, or Firm* — Myers Bigel Sibley & Sajovec, P.A.

(57) ABSTRACT

Semiconductor devices including a first transistor and a second transistor are integrated on a substrate. Each of the first and second transistors include a nano-sized active region including source and drain regions provided in respective end portions of the nano-sized active region and a channel forming region provided between the source and drain regions. The source and drain regions of the first transistor have the same conductivity type as those of the second transistor, and the second transistor has a threshold voltage lower than that of the first transistor. The channel forming region of the second transistor may include a homogeneously doped region, whose conductivity type is the same as the source and drain regions of the second transistor and is different from the channel forming region of the first transistor.

23 Claims, 25 Drawing Sheets

(51) Int. Cl.
    *H01L 21/8234*    (2006.01)
    *H01L 21/8238*    (2006.01)
    *H01L 27/092*     (2006.01)

(56) References Cited

U.S. PATENT DOCUMENTS

| | | |
|---|---|---|
| 6,750,673 B1 | 6/2004 | Huang et al. |
| 6,812,521 B1 * | 11/2004 | He et al. ............... 257/319 |
| 6,970,031 B1 | 11/2005 | Martin et al. |
| 7,132,878 B2 | 11/2006 | Chen et al. |
| 7,317,230 B2 | 1/2008 | Lee et al. |
| 7,378,710 B2 | 5/2008 | Breitwisch et al. |
| 7,453,124 B2 | 11/2008 | Adan |
| 8,053,822 B2 | 11/2011 | Kim et al. |
| 2005/0173768 A1 | 8/2005 | Lee et al. |
| 2005/0264340 A1 | 12/2005 | Martin et al. |
| 2005/0282342 A1 | 12/2005 | Adan |
| 2006/0068531 A1 | 3/2006 | Breitwisch et al. |
| 2006/0103450 A1 | 5/2006 | Chen et al. |
| 2007/0228425 A1 | 10/2007 | Miller et al. |
| 2008/0121992 A1 * | 5/2008 | Yi et al. ............... 257/336 |
| 2009/0065835 A1 | 3/2009 | Kim et al. |

FOREIGN PATENT DOCUMENTS

| | | |
|---|---|---|
| KR | 10-2007-0070890 A | 7/2007 |
| KR | 10-0899546 B1 | 5/2009 |
| KR | 10-1031798 B1 | 4/2011 |

OTHER PUBLICATIONS

Colinge et al, "Nanowire transistors without junctions", *Nature Nanotechnology*, Advance Online Publication: Feb. 21, 2010, pp. 1-5.

* cited by examiner

INTEGRATED JUNCTION AND JUNCTIONLESS NANOTRANSISTORS

CROSS-REFERENCE TO RELATED APPLICATION

This U.S. non-provisional patent application claims priority under 35 U.S.C. §119 to Korean Patent Application No. 10-2012-0134593, filed on Nov. 26, 2012, the entirety of which is hereby incorporated herein by reference.

BACKGROUND

Example embodiments of the inventive concepts relate to semiconductor devices, and in particular, to semiconductor devices with transistors whose threshold voltages are different from each other.

Semiconductor integrated circuit devices are increasingly being used in consumer, commercial and other electronic devices. The semiconductor devices can include a memory device for storing data, a logic device for processing data, and a hybrid device including both of memory and logic elements. Due to the increased demand for electronic devices with fast speed and/or low power consumption, the semiconductor devices should provide a fast operating speed and/or a low operating voltage. To satisfy these technical requirements, the complexity and/or increased integration density of semiconductor devices may increase.

SUMMARY

Example embodiments of the inventive concepts can provide a semiconductor device with transistors whose threshold voltages are different from each other.

According to example embodiments of the inventive concepts, a semiconductor device includes a first transistor and a second transistor integrated on a substrate, each of the first and second transistors including a nano-sized active region including source and drain regions in respective end portions of the nano-sized active region and a channel forming region between the source and drain regions. The source and drain regions of the first transistor have the same conductivity type as those of the second transistor, the second transistor has a threshold voltage lower than that of the first transistor, and the channel forming region of the second transistor may include a homogeneously doped region, whose conductivity type may be the same as the source and drain regions of the second transistor and may be different from the channel forming region of the first transistor.

In example embodiments, during an operation of the semiconductor device, carriers having the same conductivity type as minority carriers of the source and drain regions of the second transistor may be accumulated in the homogeneously doped region of the second transistor to form an inversion region.

In example embodiments, the second transistor may be turned off due to the presence of the inversion region.

In example embodiments, a depth of the inversion region from a surface of the nano-sized active region protruding from the substrate may be substantially the same as those of the source and drain regions of the second transistor.

In example embodiments, a doping concentration of the homogeneously doped region may be lower than those of the source and drain regions of the second transistor.

In example embodiments, the doping concentration of the homogeneously doped region decreases with increasing distance from the source and drain regions of the second transistor.

In example embodiments, the homogeneously doped region connects the source and drain regions of the second transistor to each other.

In example embodiments, the device may further include a third transistor including source and drain regions, whose conductivity type may be the same as those of the source and drain regions of the first transistor, and a channel forming region between the source and drain regions. The channel forming region of the third transistor may include a first homogeneously doped region connected to the source region of the third transistor, a second homogeneously doped region connected to the drain region of the third transistor, and a heterogeneously doped region connecting the first homogeneously doped region with the second homogeneously doped region. The first and second homogeneously doped regions have the same conductivity type as the source and drain regions of the third transistor, and the heterogeneously doped region has a different conductivity type from the source and drain regions of the third transistor.

In example embodiments, a threshold voltage of the third transistor may be lower than that of the first transistor and higher than that of the second transistor.

In example embodiments, the threshold voltage of the third transistor decreases with decreasing width of the heterogeneously doped region and increases with increasing width of the heterogeneously doped region.

In example embodiments, a doping concentration of the first homogeneously doped region decreases with increasing distance from the source region of the third transistor, and a doping concentration of the second homogeneously doped region decreases with increasing distance from the drain region of the third transistor.

In example embodiments, during an operation of the semiconductor device, the third transistor may be turned-off by an inversion region to be formed in the first and second homogeneously doped regions and may be turned-on by an inversion region in the heterogeneously doped region.

In example embodiments, the homogeneously doped region may include a first homogeneously doped region adjacent to the source region of the second transistor and a second homogeneously doped region adjacent to the drain region of the second transistor, and the channel forming region of the second transistor may further include a heterogeneously doped region connecting the first homogeneously doped region with the second homogeneously doped region.

In example embodiments, doping concentrations of the first and second homogeneously doped regions may be lower than those of the source and drain regions of the second transistor.

In example embodiments, a doping concentration of the first homogeneously doped region decreases from the source region of the second transistor to the heterogeneously doped region, and a doping concentration of the second homogeneously doped region decreases from the drain region of the second transistor to the heterogeneously doped region.

In example embodiments, the device may further include a fourth transistor including source and drain regions, whose conductivity type may be the same as those of the source and drain regions of the first transistor, and a channel forming region between the source and drain regions. The channel forming region of the fourth transistor may be in a substantially undoped state.

In example embodiments, a threshold voltage of the fourth transistor may be lower than that of the first transistor and higher than that of the second transistor.

In example embodiments, the device may further include device isolation layers on the substrate. The nano-sized active region extends from the substrate to between the device isolation layers, thereby having a fin-shaped structure.

In example embodiments, the fin-shaped nano-sized active region has a width of about 10 nm or less.

In example embodiments, each of the first and second transistors may further include a gate dielectric and a gate electrode that may be sequentially stacked on the nano-sized active region, and the gate electrode may include a portion extending below the nano-sized active region.

In example embodiments, the semiconductor device may include a first region provided with the first and second transistors and a second region provided with a fifth transistor, and the fifth transistor may include source and drain regions having a different conductivity type from the source and drain regions of the first transistor and a channel forming region provided between the source and drain regions, and the channel forming region of the fifth transistor may include a homogeneously doped region having the same conductivity type as those of the source and drain regions of the fifth transistor.

In example embodiments, each of the first and fifth transistors may include a gate electrode, and the gate electrodes of the first and fifth transistors include the same metal material as each other.

In example embodiments, the gate electrode of the first transistor has the same work-function as that of the fifth transistor.

According to example embodiments of the inventive concepts, a semiconductor device, including a first transistor, a second transistor, and a third transistor, each of which may include a fin portion protruding from a substrate, source and drain regions in respective end portions of the fin portion, and a channel forming region between the source and drain regions. The source and drain regions of each of the first, second, and third transistors have the same conductivity type, the channel forming region of the second transistor may include a homogeneously doped region, whose conductivity type may be different from that of the channel forming region of the first transistor and may be the same as those of the source and drain regions of the second transistor, and the channel forming region of the third transistor may include a first homogeneously doped region connected to the source region of the third transistor and having the same conductivity type as the source region of the second transistor, a second homogeneously doped region connected to the drain region of the third transistor and having the same conductivity type as the source region of the second transistor, and a heterogeneously doped region connecting the first homogeneously doped region to the second homogeneously doped region and having a different conductivity type from the source and drain regions of the second transistor.

In example embodiments, a threshold voltage of the third transistor may be lower than that of the first transistor and higher than that of the second transistor.

In example embodiments, the homogeneously doped region of the second transistor may be configured to have an inversion region, when the second transistor may be applied with a voltage lower than a threshold voltage thereof, and each of the first and second homogeneously doped regions of the third transistor may be configured to have an inversion region, when the third transistor may be applied with a voltage lower than a threshold voltage thereof.

In example embodiments, a depth of the inversion region of the second transistor from a surface of the fin portion may be substantially the same as those of the source and drain regions of the second transistor, and a depth of the inversion region of the third transistor from the surface of the fin portion may be substantially the same as those of the source and drain regions of the third transistor.

In example embodiments, the fin portion has a width of about 10 nm or less.

In example embodiments, the device may further include a fourth transistor including source and drain regions having the same conductivity type as the source and drain regions of the first transistor and a channel forming region between the source and drain regions. The channel forming region of the fourth transistor may be in a substantially undoped state.

In example embodiments, a threshold voltage of the fourth transistor may be lower than that of the first transistor and higher than that of the second transistor.

In example embodiments, a doping concentration of the homogeneously doped region of the second transistor may be lower than those of the source and drain regions of the second transistor.

In example embodiments, the semiconductor device may include a first region provided with the first and second transistors and a second region provided with a fifth transistor, and the fifth transistor may include source and drain regions having a different conductivity type from the source and drain regions of the first transistor and a channel forming region provided between the source and drain regions, and the channel forming region of the fifth transistor may include a homogeneously doped region having the same conductivity type as the source and drain regions of the fifth transistor.

In example embodiments, each of the first and fifth transistors may include a gate electrode, and the gate electrodes of the first and fifth transistors include the same metal material as each other.

In example embodiments, the gate electrode of the first transistor has the same work-function as that of the fifth transistor.

According to example embodiments of the inventive concepts, an SRAM device may include a driver transistor including a source region that may be connected to a ground line, a transfer transistor including a drain region that may be connected to a bit line, the transfer transistor being connected in series to the driver transistor, and a load transistor including source and drain regions that may be electrically connected to a power line and a drain region of the driver transistor, respectively. The load transistor may be a MOS transistor having a different conductivity type from the driver and transfer transistors, gate electrodes of the load, driver, or transfer transistors may include the same metal material, and at least one of the load, driver, and transfer transistors may be configured in such a way that a channel forming region thereof may include a homogeneously doped region having the same conductivity type as the source and drain regions thereof.

In yet other example embodiments, a semiconductor device comprises a junctionless nanotransistor and a junction nanotransistor integrated on a common substrate In some embodiments, the junction nanotransistor comprises spaced apart source and drain regions in a nano-sized active region on the common substrate and a gate on the nano-sized active region therebetween, at least a portion of the nano-sized active region adjacent the gate being a different conductivity type than the spaced apart source and drain regions.

In other embodiments, the junction nanotransistor comprises spaced apart source and drain regions in a nano-sized active region on the common substrate and a gate on the nano-sized active region therebetween, at least a portion of the nano-sized active region adjacent the gate being undoped.

In other embodiments, the junction nanotransistor comprises spaced apart source and drain regions in a nano-sized active region on the common substrate and a gate on the nano-sized active region therebetween, the nano-sized active region adjacent the gate comprising a first region that is a different conductivity type than the spaced apart source and drain regions and a second region that is a same conductivity type as the spaced apart source and drain regions.

In other embodiments, the junctionless nanotransistor comprises first and second junctionless nanotransistors that are of opposite conductivity types.

In other embodiments, the junctionless nanotransistor comprises spaced apart source and drain regions in a nano-sized active region on the common substrate and a gate on the nano-sized active region therebetween, the spaced apart source and drain regions and the nano-sized active region adjacent the gate being a same conductivity type.

In other embodiments, the junctionless nanotransistor and the junction nanotransistor both comprise spaced apart source and drain regions in a nano-sized active region on the common substrate and a gate on the nano-sized active region therebetween, the spaced apart source and drain regions of the junctionless nanotransistor and of the junction nanotransistor all being of same conductivity type.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 12A through 17A are sectional views of the first to third transistors to describe a method of fabricating a semiconductor device according to example embodiments of the inventive concepts.

FIGS. 12B through 17B are sectional views of the fourth and fifth transistors to describe a method of fabricating a semiconductor device according to example embodiments of the inventive concepts.

Figure 1:
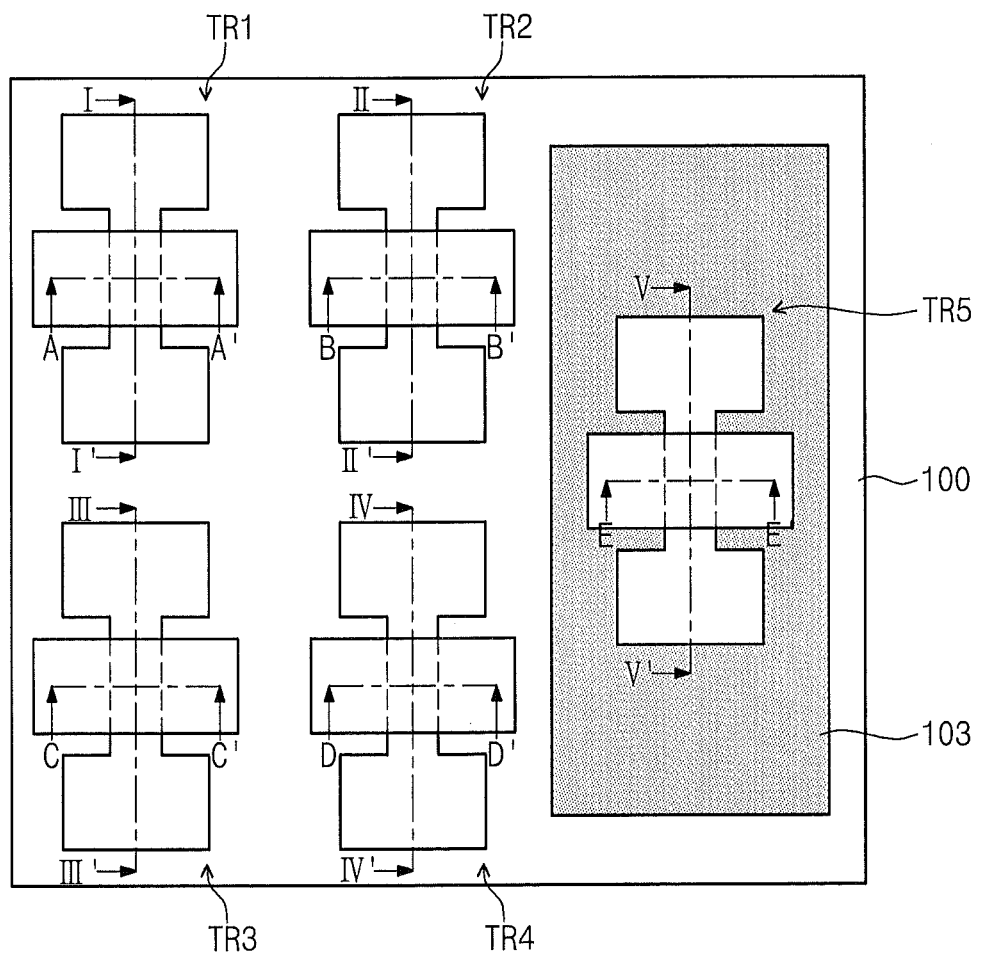
FIG. 1 is a plan view illustrating a semiconductor device according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments, unless indicated otherwise.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
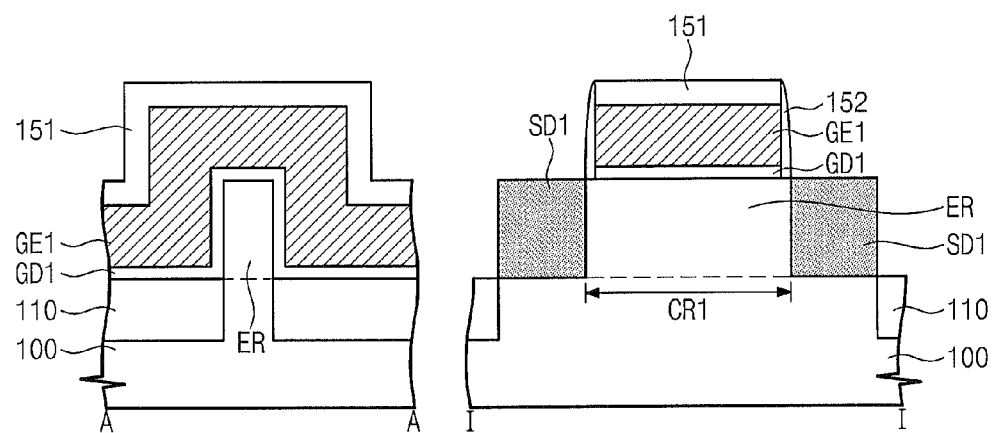
FIG. 2 is a diagram illustrating vertical sections of the first transistor taken along lines A-A' and I-I' of FIG. 1.
Figure 3:
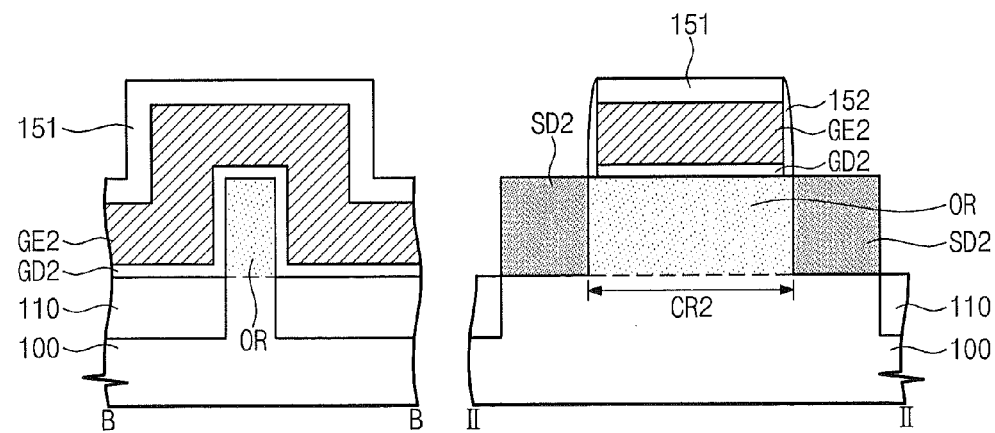
FIG. 3 is a diagram illustrating vertical sections of the first transistor taken along lines B-B' and II-II' of FIG. 1.
Figure 4:
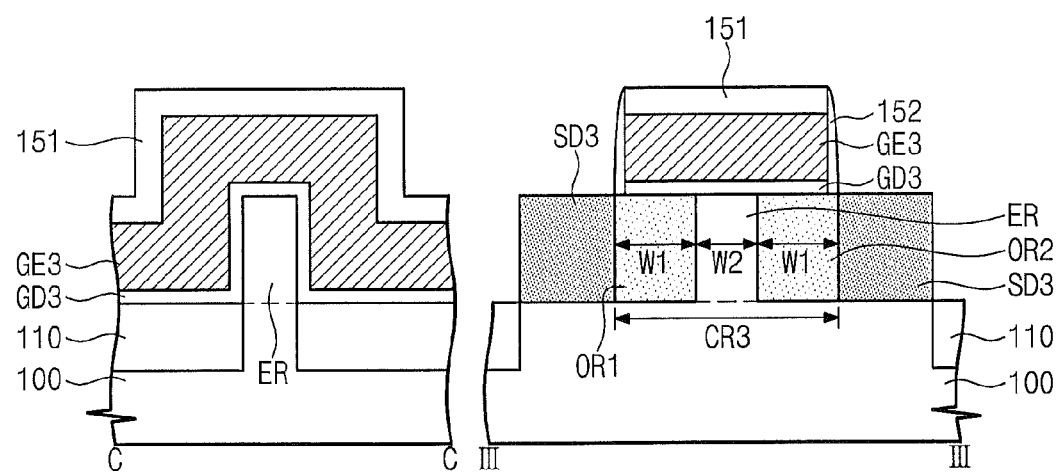
FIG. 4 is a diagram illustrating vertical sections of the first transistor taken along lines C-C' and III-III' of FIG. 1.
Figure 5:
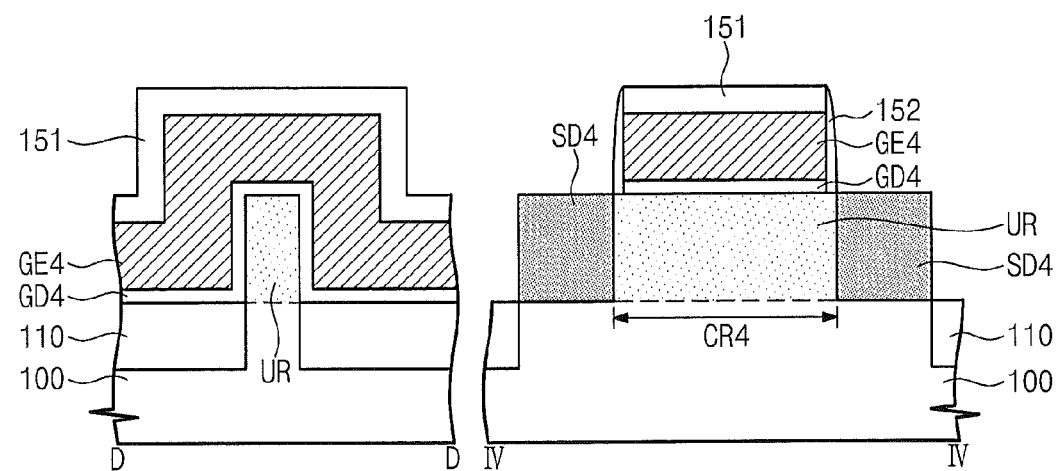
FIG. 5 is a diagram illustrating vertical sections of the first transistor taken along lines D-D' and IV-IV' of FIG. 1.
Figure 6:
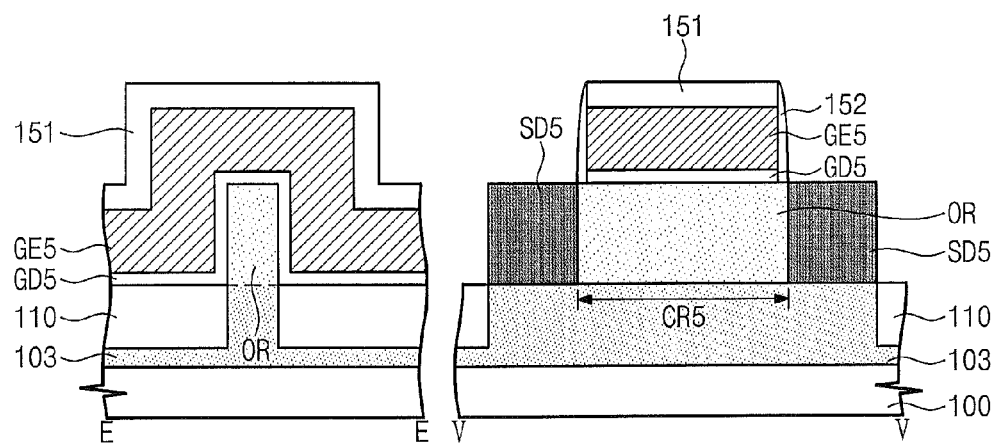
FIG. 6 is a diagram illustrating vertical sections of the first transistor taken along lines E-E' and V-V' of FIG. 1.

FIG. 1 is a plan view illustrating a semiconductor device including first through fifth transistors according to example embodiments of the inventive concepts. FIG. 2 is a diagram illustrating vertical sections of the first transistor taken along lines A-A' and I-I' of FIG. 1. FIG. 3 is a diagram illustrating vertical sections of the second transistor taken along lines B-B' and II-II' of FIG. 1. FIG. 4 is a diagram illustrating vertical sections of the third transistor taken along lines C-C' and III-III' of FIG. 1. FIG. 5 is a diagram illustrating vertical sections of the fourth transistor taken along lines D-D' and IV-IV' of FIG. 1. FIG. 6 is a diagram illustrating vertical sections of the fifth transistor taken along lines E-E' and V-V' of FIG. 1.

Referring to FIGS. 1 through 6, a plurality of transistors TR1, TR2, TR3, TR4, and TR5 may be provided on a substrate 100. For example, the first transistor TR1, the second transistor TR2, the third transistor TR3, and the fourth transistor TR4 may be transistors of first conductivity type, and the fifth transistor TR5 may be a transistor of second conductivity type. In example embodiments, the first conductivity type may be n-type, and the second conductivity type may be p-type. Hereinafter, for the sake of simplicity, the description that follows will refer to an example of the present embodiment in which the first to fourth transistors TR1-TR4 are NMOS transistors and the fifth transistor TR5 is a PMOS transistor. However, in other embodiments, conductivity types of the transistors may be configured in the reverse manner.

Each of the first to fifth transistors TR1-TR5 may include a nano-sized active region provided on the substrate 100. For example, as shown, the nano-sized active region may be shaped like a fin extending from the substrate 100 to a region between device isolation layers 110. Alternatively, in the case where the substrate 100 is a silicon-on-insulator (SOI) wafer, the device isolation layers 110 may be omitted. The structure of the nano-sized active region is not limited to the fin shape and is variously modified according to example embodiments of the inventive concepts. The description that follows will refer to example embodiments in which the nano-sized active region has a width of about 10 nm or less and has fin-shaped, omega-shaped, and wire-shaped structures shown in FIGS. 2 through 6, FIG. 19, and FIG. 20, respectively.

The first to fourth transistors TR1-TR4 may be NMOS transistors having n-type source/drain (S/D) regions. For example, all of a first S/D region SD1 of the first transistor TR1, a second S/D region SD2 of the second transistor TR2, a third S/D region SD3 of the third transistor TR3, and a fourth S/D region SD4 of the fourth transistor TR4 are n-type doped regions. By contrast, since the fifth transistor TR5 is a PMOS transistor, a fifth S/D region SD5 of the fifth transistor TR5 may be a p-type doped region. In example embodiments, the first to fourth S/D regions SD1-SD4 may have an n-type doping concentration of about $1 \times 10^{20}$ atm/cm$^3$ to about $1 \times 10^{21}$ atm/cm$^3$, and the fifth S/D region SD4 may have a p-type doping concentration of about $1 \times 10^{20}$ atm/cm$^3$ to about $1 \times 10^{21}$ atm/cm$^3$.

The first to fifth transistors TR1-TR5 may include gate dielectrics GD1-GD5 and gate electrodes GE1-GE5 sequentially provided on the fin-shaped nano-sized active regions thereof. Capping patterns 151 may be provided on the gate electrodes GE1-GE5, respectively, and spacers 152 may be provided on sidewalls of the gate electrodes GE1-GE5. The gate dielectrics GD1-GD5 may include a silicon oxide layer or a silicon oxynitride layer. In other embodiments, the gate dielectrics GD1-GD5 may include high-k dielectrics, such as hafnium oxide (HfO), aluminum oxide (AlO), or tantalum oxide (TaO), having a dielectric constant higher than that of the silicon oxide layer. The gate electrodes GE1-GE5 may include semiconductor materials (e.g., silicon or germanium), conductive metal nitrides, and/or metals. Each of the capping patterns 151 and the spacers 152 may include at least one of silicon oxide layer, silicon nitride layer, and silicon oxynitride layer.

Figure 8:
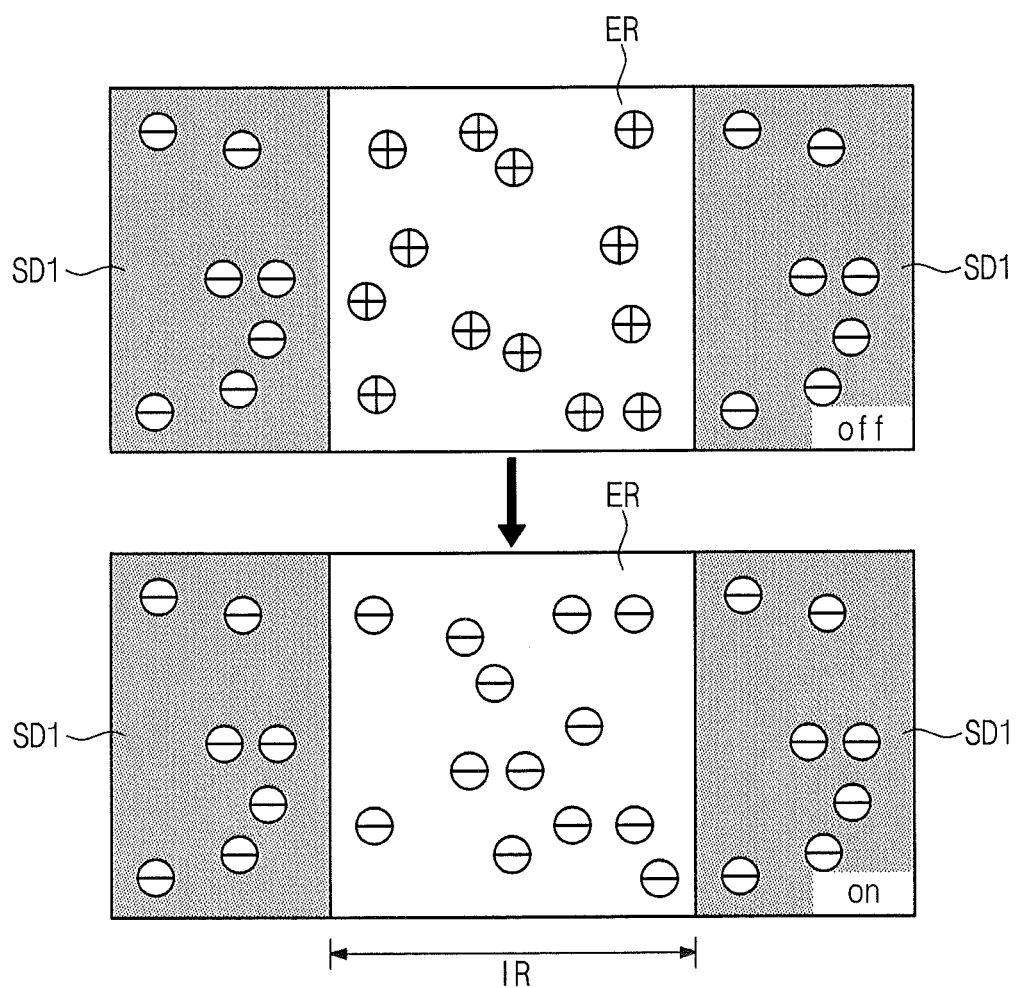
FIG. 8 is a schematic diagram illustrating on- and off-states of the first transistor.

Hereinafter, the first transistor TR1 will be described in more detail with reference to FIGS. 2 and 8. FIG. 8 is a schematic diagram illustrating on- and off-states of the first transistor. The first transistor TR1 may be an inversion-type MOSFET transistor. For example, a region (i.e., a channel forming region CR1) between source and drain regions of the first transistor TR1 may include a heterogeneously doped region ER having a conductivity type different from that of the first S/D region SD1. Hereinafter, the channel forming region may refer to a region that can serve as a pathway electrically connecting the source region to the drain region, when a specific voltage is applied to the gate electrode. As shown in FIG. 8, when the first transistor TR1 is applied with a gate voltage that is lower than a threshold voltage Vt1 thereof, the first transistor TR1 may be in an off-state, due to the presence of the p-type region (i.e., the heterogeneously doped region ER) interposed between the first S/D regions SD1. By contrast, in the case where the first transistor TR1 is applied with a gate voltage that is higher than the threshold voltage Vt1 thereof, minority carriers (e.g., electrons) may be accumulated in the heterogeneously doped region ER to form an inversion region IR electrically connecting the first S/D regions SD1 to each other, and thus, the first transistor TR1 may be in an on-state.

Figure 7:
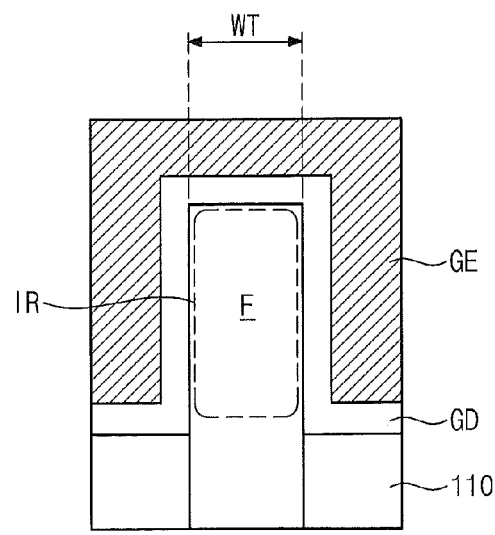
FIG. 7 is a schematic diagram illustrating an inversion region according to example embodiments of the inventive concepts.

FIG. 7 is a schematic diagram illustrating an inversion region according to example embodiments of the inventive concepts. In the case where a fin F has a width WT of about 10 nm or less, electric charges in the fin F can be moved within a spatially confined narrow region. As a result, when a gate is applied with a voltage that is higher than a threshold voltage of the transistor, an inversion region IR may be formed in all of a surface-neighboring region and a central region of the fin F, which may be called a "volume inversion".

Figure 9:
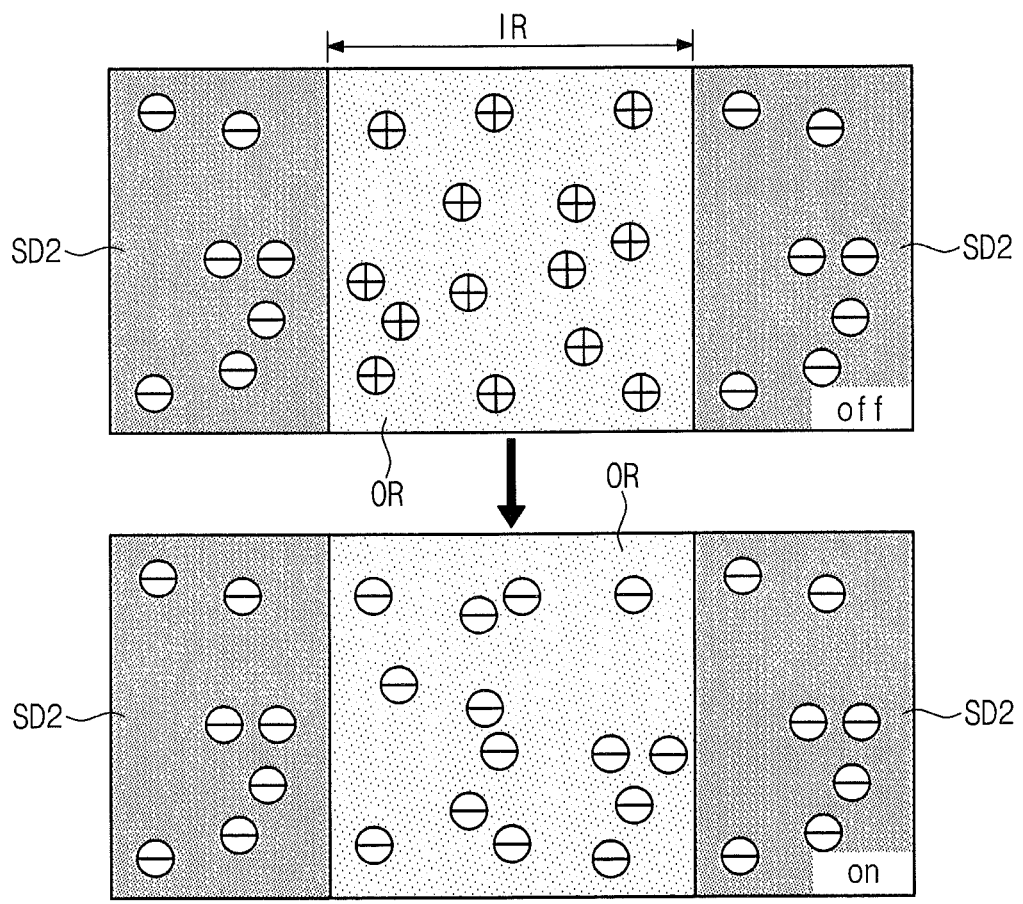
FIG. 9 is a schematic diagram illustrating on- and off-states of the second transistor.

According to example embodiments of the inventive concepts, by using such a volume inversion, the second transistor TR2 may be configured to have a different threshold voltage from that of the first transistor TR1. Hereinafter, the second transistor TR2 will be described in more detail with reference to FIGS. 3 and 9. FIG. 9 is a schematic diagram illustrating on- and off-states of the second transistor TR2. The second transistor TR2 may be an accumulation-type MOSFET. For example, a second channel forming region CR2 of the second transistor TR2 may include a homogeneously doped region OR having the same conductivity type as that of the second S/D regions SD2 of the second transistor TR2. The homogeneously doped region OR may have a doping concentration that is lower than that of the second S/D regions SD2. For example, the homogeneously doped region OR may have an n-type doping concentration of about $1\times10^{19}$ atm/cm$^3$ to about $1\times10^{20}$ atm/cm$^3$, and the second S/D regions SD2 may have an n-type doping concentration of about $1\times10^{20}$ atm/cm$^3$ to about $1\times10^{21}$ atm/cm$^3$. In example embodiments, the homogeneously doped region OR may be configured to have a doping concentration that decreases continuously with increasing distance from the second S/D regions SD2. For example, the doping concentration of the homogeneously doped region OR may decrease continuously from a portion adjacent to the second S/D regions SD2 to a central portion of the homogeneously doped region OR. In other embodiments, the doping concentration of the homogeneously doped region OR may be higher than or equivalent to those of the second S/D regions SD2. The homogeneously doped region OR may be connected to the second S/D regions SD2 of the second transistor TR2.

As shown in FIG. 9, when the second transistor TR2 is applied with a gate voltage that is lower than a threshold voltage Vt2 thereof, an inversion region IR may be formed in the n-type region (i.e., the homogeneously doped region OR) interposed between the second S/D regions SD2, the second transistor TR2 may be in an off-state. For example, when the second transistor TR2 is applied with the gate voltage that is lower than the threshold voltage Vt2, the inversion region may be formed, in the homogeneously doped region OR, by electric charges having the same conductivity type as minority carriers of the S/D region of the second transistor TR2. In other words, holes may accumulate in the homogeneously doped region OR and thereby form the inversion region IR that separates the second S/D regions SD2 electrically from each other.

In the case where the second transistor TR2 is applied with a gate voltage that is higher than the threshold voltage Vt2 thereof, the inversion region IR may vanish from the homogeneously doped region OR and majority carriers (e.g., electrons) may accumulate in the homogeneously doped region OR to connect the second S/D regions SD2 electrically to each other, and thus, the second transistor TR2 may become an on-state.

On and off-states of the second transistor TR2 may be easily controlled by using the afore-described volume inversion. For example, in the case where the inversion region IR of the second transistor TR2 is locally formed near a surface of the nano-sized active region (i.e., in a portion adjacent to the gate electrode) like the conventional planar transistor, there may be many majority carriers (e.g., electrons) of the homogeneously doped region OR in a portion of the homogeneously doped region OR, where the inversion region IR is not formed. The electrons may prevent the second transistor TR2 from being fully turned off. By contrast, according to example embodiments of the inventive concepts, when the second transistor TR2 is turned off, a depth of the inversion region IR, which is measured from a surface of the nano-sized active region protruding from the substrate 100, may be substantially equivalent to that of the second S/D regions SD2 of the second transistor TR2. In other words, the inversion region may be formed in the substantially whole region of the homogeneously doped region OR, and thus, the second transistor TR2 may be fully turned off. Accordingly, the semiconductor device may be configured to include the accumulation-type transistor, whose on- and off-states can be easily controlled.

The threshold voltage Vt2 of the second transistor TR2 may be lower than the threshold voltage Vt1 of the first transistor TR1. In other words, since the majority carriers of the homogeneously doped region OR are used to achieve the on-state of the second transistor TR2 unlike the first transistor TR1, the second transistor TR2 may have a relatively lower threshold voltage than the first transistor TR1.

Figure 10:
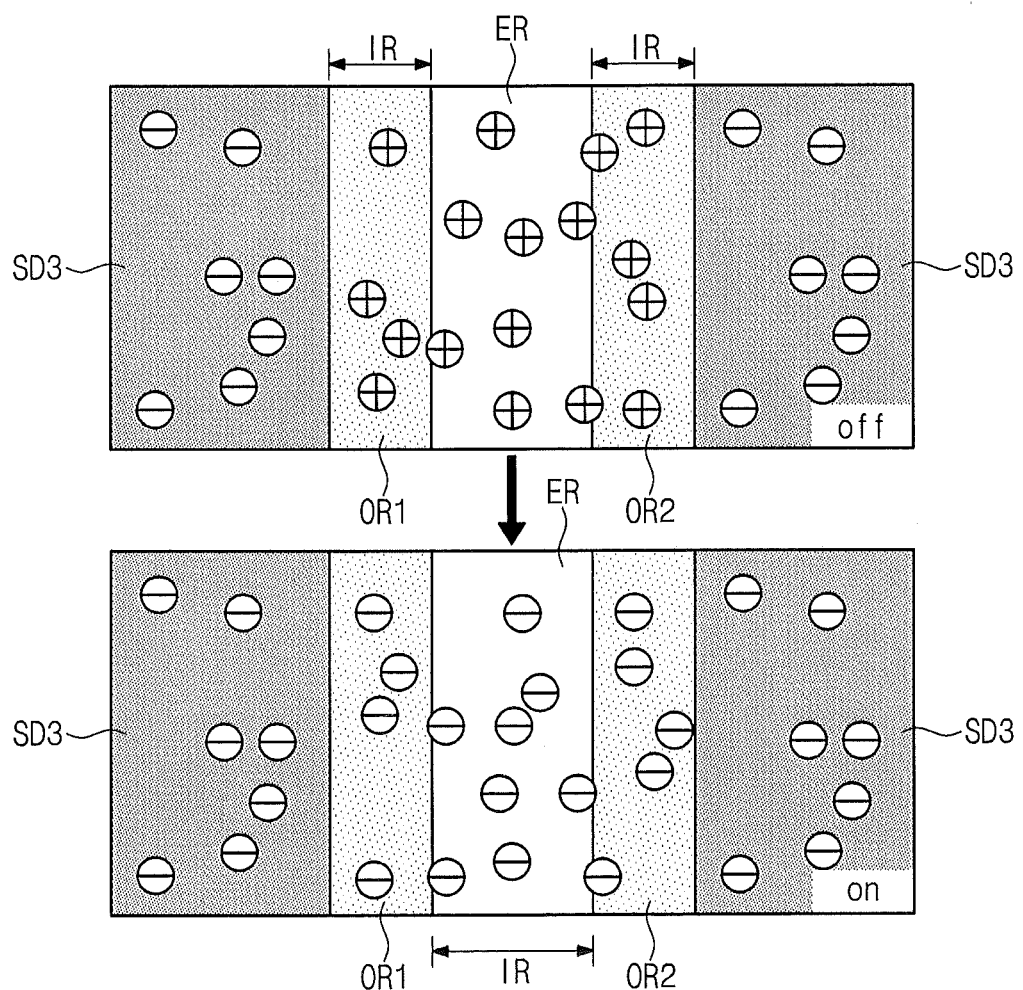
FIG. 10 is a schematic diagram illustrating on- and off-states of the third transistor.

Hereinafter, the third transistor TR3 will be described in more detail with reference to FIGS. 4 and 10. FIG. 10 is a schematic diagram illustrating on- and off-states of the third transistor TR3. The third transistor TR3 may be a transistor configured to have an intermediate property and structure between the accumulation-type transistor and the inversion type transistor. For example, a third channel forming region CR3 of the third transistor TR3 may include a first homogeneously doped region OR1 and a second homogeneously doped region OR2 that are connected to the third S/D regions SD3, respectively. The first homogeneously doped region OR1 and the second homogeneously doped region OR2 may be connected to each other by a heterogeneously doped region ER provided therebetween. The homogeneously doped regions OR1 and OR2 may be configured to have the same conductivity type as the third S/D regions SD3, while the heterogeneously doped region ER may be configured to have a different conductivity type from the third S/D regions SD3.

Doping concentrations of the homogeneously doped regions OR1 and OR2 may be lower than that of the third S/D regions SD3. For example, the homogeneously doped regions OR1 and OR2 may have an n-type doping concentration of about $1\times10^{19}$ atm/cm$^3$ to about $1\times10^{20}$ atm/cm$^3$, and the third S/D regions SD3 may have an n-type doping concentration of about $1\times10^{20}$ atm/cm$^3$ to about $1\times10^{21}$ atm/cm$^3$. The homogeneously doped regions OR1 and OR2 may be configured to have doping concentrations that decrease continuously with increasing distance from the third S/D regions SD3. For example, the doping concentrations of the homogeneously doped regions OR1 and OR2 may decrease continuously from an outer portion adjacent to the third S/D regions SD3 to an inner portion adjacent to the heterogeneously doped region ER. In other embodiments, the doping concentrations of the homogeneously doped regions OR1 and OR2 may be higher than or equivalent to those of the third S/D regions SD3. The doping concentrations of the homogeneously doped regions OR1 and OR2 may be adjusted to realize a desired threshold voltage of the third transistor TR3. For example, the doping concentrations of the homogeneously doped regions OR1 and OR2 may be increased to realize the third transistor TR3 with a decreased threshold voltage. Alternatively, the doping concentrations of the homogeneously doped regions OR1 and OR2 may be decreased to realize the third transistor TR3 with an increased threshold voltage.

As shown in FIG. 10, when the third transistor TR3 is applied with a gate voltage that is lower than a threshold voltage Vt3 thereof, an inversion region IR may be formed in the homogeneously doped regions OR1 and OR2. For example, when the third transistor TR3 is applied with the gate voltage that is lower than the threshold voltage Vt3, minority carriers (e.g., holes) may accumulate in the homogeneously doped regions OR1 and OR2 to form the inversion region IR. Since a majority carrier of the heterogeneously doped region ER is a hole, there may be many holes in the heterogeneously doped region ER under a gate voltage lower than the threshold voltage Vt3. Due to the inversion region IR formed in the homogeneously doped regions OR1 and OR2 and the majority carriers existing in the heterogeneously doped region ER, the third transistor TR3 may be turned off.

In the case where the third transistor TR3 is applied with a gate voltage that is higher than the threshold voltage Vt3, the inversion region IR may vanish from the homogeneously doped regions OR1 and OR2, and the inversion region IR may be formed in the heterogeneously doped region ER. As a result, the third S/D regions SD3 may be electrically connected to each other by the majority carriers (e.g., electrons) in the homogeneously doped regions OR1 and OR2, and the inversion region formed in the heterogeneously doped region ER, and thus, the third transistor TR3 may be in an on-state.

The threshold voltage Vt3 of the third transistor TR3 may be higher than the threshold voltage Vt2 of the second transistor TR2 and lower than the threshold voltage Vt1 of the first transistor TR1. In other words, due to the presence of the homogeneously doped regions OR1 and OR2, the third transistor TR3 may have the threshold voltage lower than that of the first transistor TR1. The threshold voltage Vt3 may be controlled by adjusting a ratio of a width W1 of the homogeneously doped regions OR1 and OR2 to a width W2 of the heterogeneously doped region ER. For example, in the case where the width W1 increases and the width W2 decreases, the threshold voltage Vt3 of the third transistor TR3 may decrease to a level close to that of the accumulation-type transistor (e.g., the threshold voltage Vt2). By contrast, in the case where the width W1 decreases and the width W2 increases, the threshold voltage Vt3 of the third transistor TR3 may increase to a level close to that of the inversion type transistor (e.g., the threshold voltage Vt1). In example embodiments, the width W1 may be substantially equivalent to the width W2, but example embodiments of the inventive concepts may not be limited thereto and be modified in consideration of a desired threshold voltage.

Figure 11:
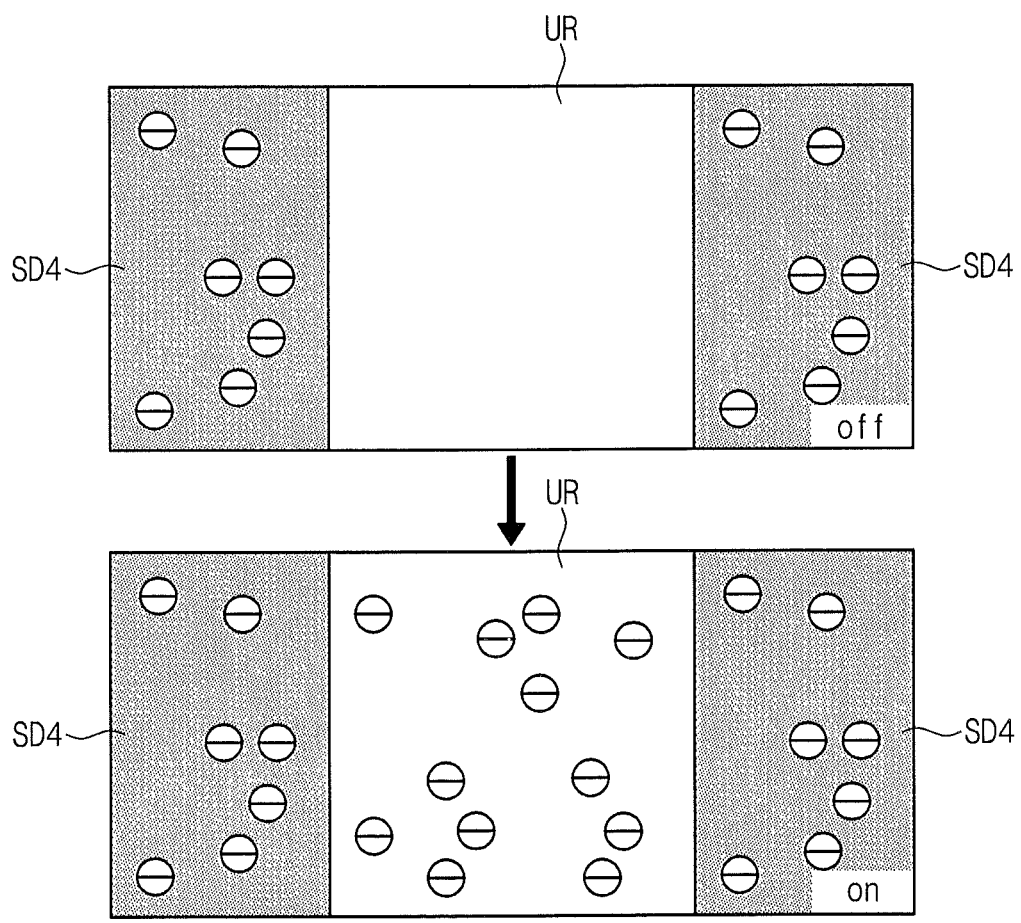
FIG. 11 is a schematic diagram illustrating on- and off-states of the fourth transistor.

Hereinafter, the fourth transistor TR4 will be described in more detail with reference to FIGS. 5 and 11. FIG. 11 is a schematic diagram illustrating on- and off-states of the fourth transistor TR4. The fourth transistor TR4 may include an undoped region UR provided between the fourth S/D regions SD4. At least a portion of the fourth channel forming region CR4 may be in a substantially undoped state. In the present specification, the term "substantially undoped state" may means that a region under consideration has a net charge concentration of substantially zero. For example, in the case where the undoped state of a region under consideration is achieved by counter-doping the substrate with dopants having a different conductivity type from the substrate, the region under consideration may have a net carrier concentration of about $1\times10^{10}$ atm/cm$^3$ or less.

When the fourth transistor TR4 is applied with a gate voltage lower than a threshold voltage Vt4 thereof, the fourth transistor TR4 may be in off state. When the fourth transistor TR4 is applied with a gate voltage higher than the threshold voltage Vt4 thereof, electrons may accumulate in the undoped region UR and thus, the fourth transistor TR4 may be in an on-state.

The threshold voltage Vt4 of the fourth transistor TR4 may be lower than the threshold voltage Vt1 of the first transistor TR1 and higher than the threshold voltage Vt2 of the second transistor TR2. For example, the threshold voltage Vt4 of the fourth transistor TR4 may be lower than the threshold voltage Vt1 of the first transistor TR1 and higher than the threshold voltage Vt3 of the third transistor TR3. Alternatively, the threshold voltage Vt3 of the third transistor TR3 may be higher than that of the fourth transistor TR4, if a ratio between widths of the homogeneously and heterogeneously doped regions is adjusted.

Hereinafter, the fifth transistor TR5 will be described in more detail with reference to FIG. 6. The fifth transistor TR5 may be an accumulation-type PMOS transistor. For example, the fifth transistor TR5 may be configured to have p-type fifth S/D regions SD5 and a p-type fifth channel forming region CR5 between the fifth S/D regions SD5. In other words, the fifth channel forming region CR5 may be provided to include the homogeneously doped region OR. The accumulation-type transistor may be switched between on- and off-states in the similar manner to that of FIG. 9, except for the technical difference related to opposite conductivity types.

A gate electrode GE5 of the fifth transistor TR5 may include the same metal material as that for the gate electrodes GE1-GE4 of the first to fourth transistors TR1-TR4. For example, the gate electrode GE5 of the fifth transistor TR5 may be formed of a material whose work-function is the same as that of the gate electrodes GE1-GE4 of the first to fourth transistors TR1-TR4. For example, the gate electrodes GE1-GE5 of the first to fifth transistors TR1-TR5 may have a work-function of about 4.3 eV. For example, the gate electrodes GE1-GE5 may be simultaneously formed of the same metal material using the same process. For example, the first to fifth gate electrodes GE1-GE5 may include at least one of tungsten, titanium, tantalum, or conductive nitrides thereof. In the case where the gate electrode GE5 of the fifth transistor TR5, which is a PMOS transistor, is formed of the same material as those of the first to fourth transistors TR1-TR4, which are NMOS transistors, the fifth transistor TR5 may have an increased threshold voltage. However, as described above, in the case where the fifth transistor TR5 is the accumulation-type transistor, the fifth transistor TR5 may have a lowered threshold voltage, compared with the case of the inversion type transistor. In the case where the gate electrode GE5 of the fifth transistor TR5 is formed of a low work-function metal like those of the first to fourth transistors TR1-TR4, the lowered threshold voltage of the fifth transistor TR5 may be increased. In other words, the threshold voltage of the fifth transistor TR5 may be increased to a level close to that of the first transistor TR1, which is the inversion type transistor.

According to example embodiments of the inventive concepts, each semiconductor device may be configured to include a plurality of transistors, whose threshold voltages are different from each other. The following table shows some examples of various transistor combinations for the semiconductor device.

|  | First Transistor | Second Transistor | Third Transistor | Fourth Transistor |
|---|---|---|---|---|
| Device configured to have two different transistor threshold voltages | ○ | X | X | ○ |
|  | ○ | X | ○ | X |
|  | X | ○ | X | ○ |
|  | ○ | ○ | X | X |
|  | X | ○ | ○ | X |
|  | X | X | ○ | ○ |
| Device configured to have three different transistor threshold voltages | ○ | X | ○ | ○ |
|  | ○ | ○ | X | ○ |
|  | ○ | ○ | ○ | X |
|  | X | ○ | ○ | ○ |
| Device configured to have four different transistor threshold voltages | ○ | ○ | ○ | ○ |

(○: included, X: not included)

Although the threshold voltages were described based on NMOS transistors, technical features related to the threshold voltages may be applied to the cases of PMOS transistors. For example, in the case where the first to fourth transistors TR1-TR4 are PMOS transistors, the threshold voltages of the first to fourth transistors TR1-TR4 may satisfy absolute value conditions of |Vt1|>|Vt3|>|Vt2| and 2) |Vt1|>|Vt4|>|Vt3| or |Vt3|>|Vt4|>|Vt2|.

[Fabrication Method]

FIGS. 12A through 17A are sectional views of the first to third transistors to describe a method of fabricating a semiconductor device according to example embodiments of the inventive concepts, and FIGS. 12B through 17B are sectional views of the fourth and fifth transistors to describe a method of fabricating a semiconductor device according to example embodiments of the inventive concepts. The sectional views of the first to fifth transistors are taken along lines I-I', II-II', III-III', IV-IV', V-V' of FIG. 1, respectively.

Figure 12A:
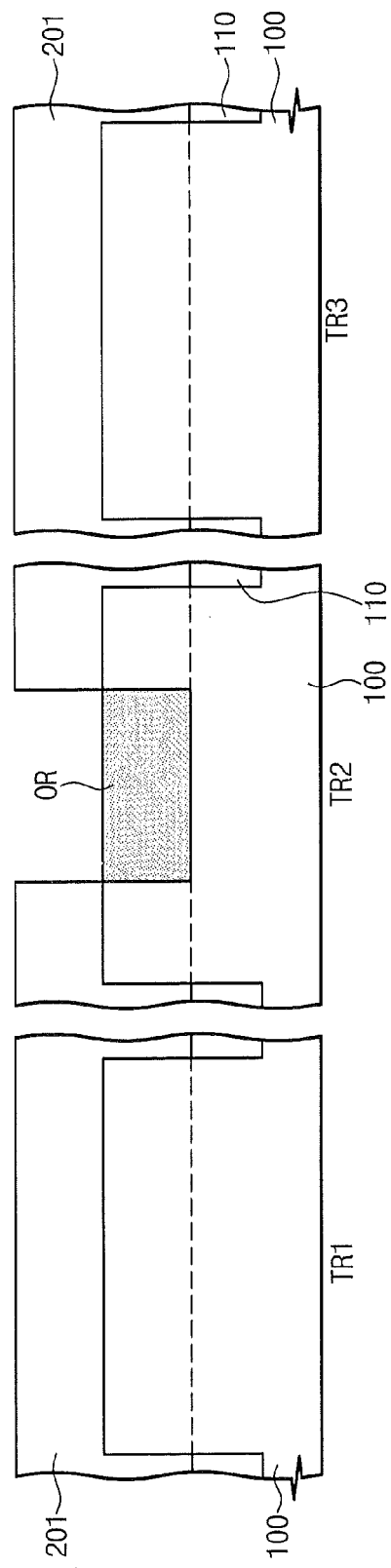
Figure 12B:
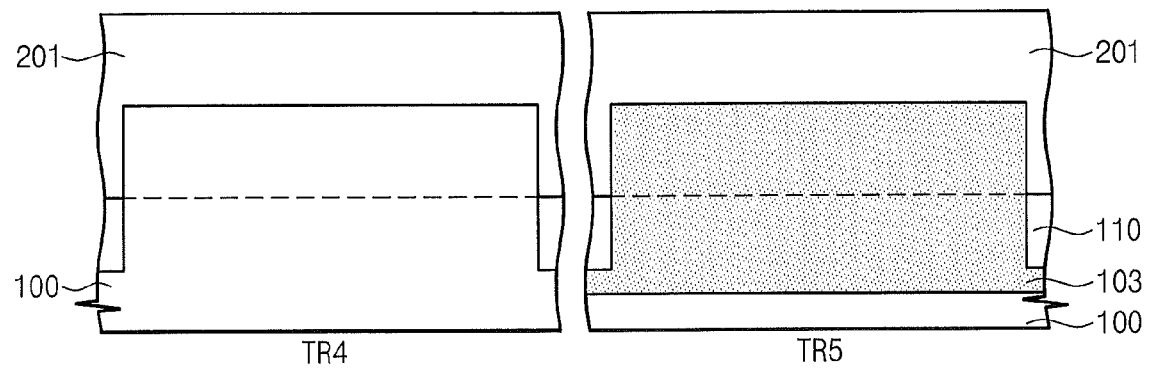

Referring to FIGS. 12A and 12B, a substrate 100 with an NMOS transistor region and a PMOS transistor region is provided. For example, the substrate 100 may be provided in the form of a p-type wafer, and a well region 103, an n-type impurity region, may be formed in the substrate 100. The well region 103 may be formed by forming a mask pattern (not shown) on the substrate 100 and performing an ion implantation process.

Fin-shaped nano-sized active regions may be formed on the substrate 100. The fin-shaped nano-sized active regions may be formed by forming device isolation layers 110 on the substrate 100 and then etching upper portions of the device isolation layers 110. Alternatively, the fin-shaped nano-sized active regions may be formed by performing an epitaxial process to the substrate 100 exposed by the device isolation layers 110. In other example embodiments, the fin-shaped nano-sized active regions may be realized using a SOI wafer.

A first mask pattern 201 may be formed to expose the nano-sized active region of the second transistor TR2. The first mask pattern 201 may include at least one of a silicon nitride layer, a silicon oxide layer, and a silicon oxynitride layer. Mask patterns to be described below may be formed of the same material as the first mask pattern 201. An ion implantation process may be performed to the nano-sized active region of the second transistor TR2 exposed by the first mask pattern 201 to form a homogeneously doped region OR. The homogeneously doped region OR may be n-type. For example, the homogeneously doped region OR of the second transistor TR2 may have substantially the same doping concentration as the well region 103.

Figure 13A:
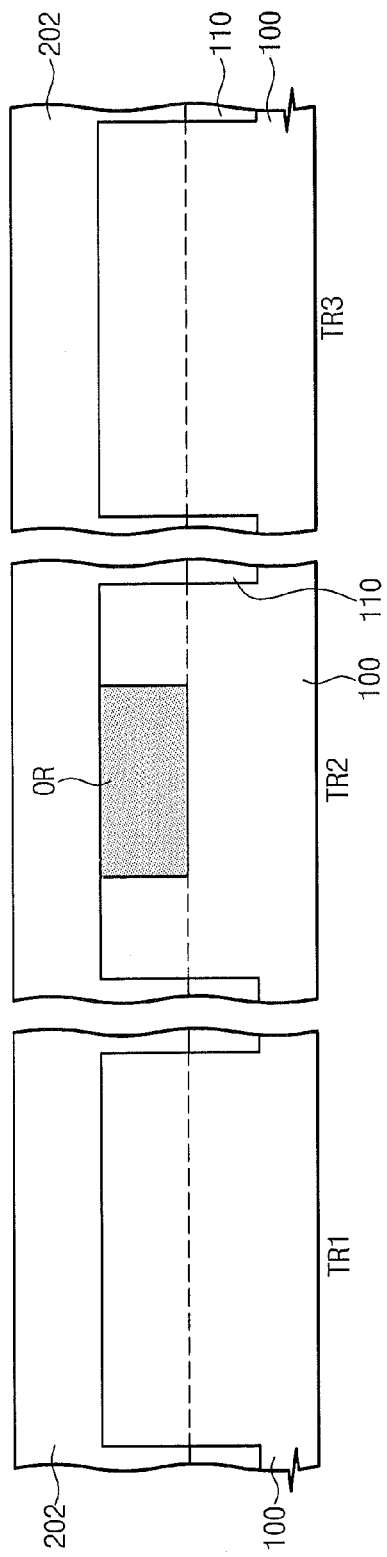
Figure 13B:
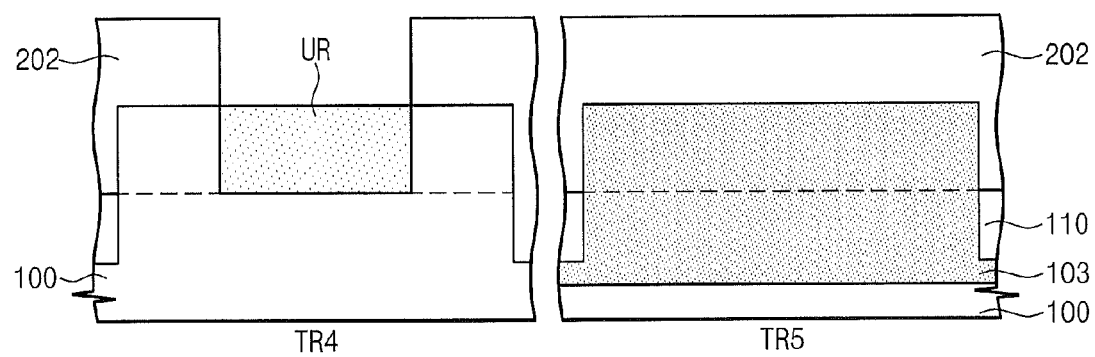

Referring to FIGS. 13A and 13B, the first mask pattern 201 may be removed, and then, a second mask pattern 202 may be formed to expose the nano-sized active region of the fourth transistor TR4. An ion implantation process may be performed to the nano-sized active region of the fourth transistor TR4 exposed by the second mask pattern 202 to form an undoped region UR. For example, the undoped region UR may be formed by counter-doping the substrate 100 with n-type dopants having substantially the same doping concentration as a p-type doping concentration of the substrate 100.

Figure 14A:
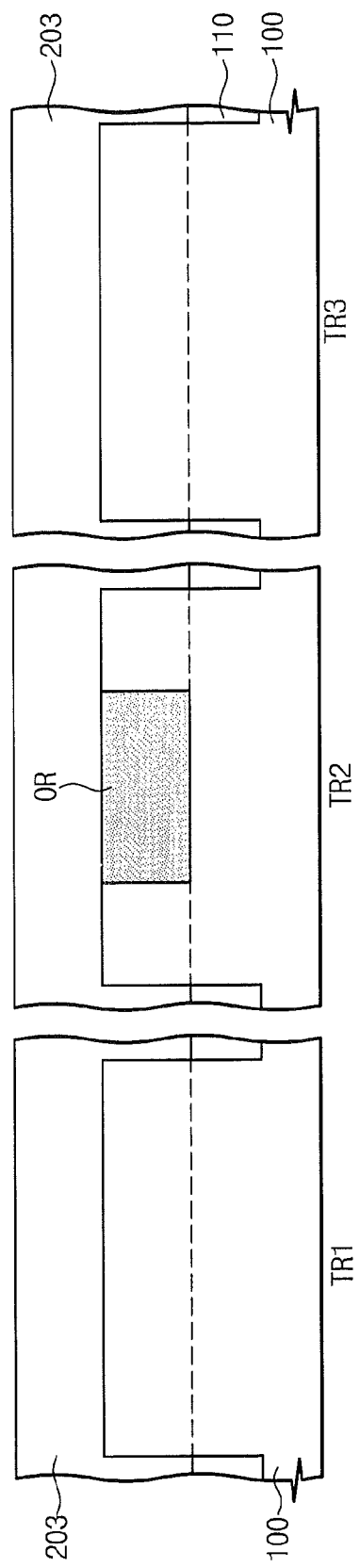
Figure 14B:
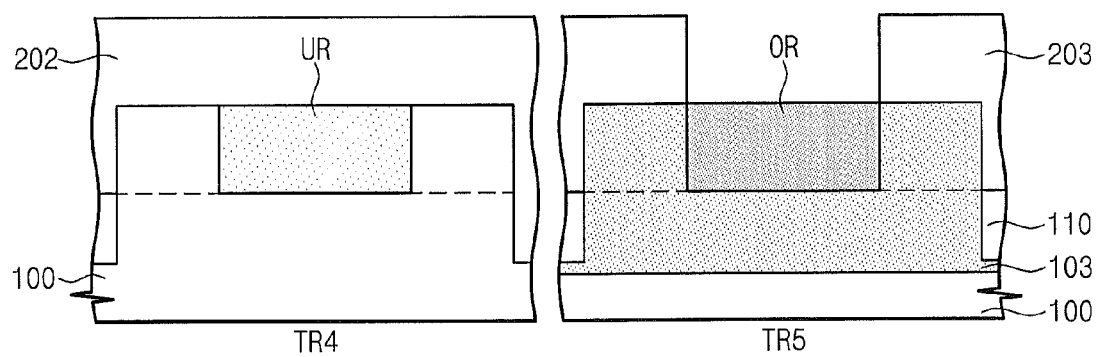

Referring to FIGS. 14A and 14B, the second mask pattern 202 may be removed, and then, a third mask pattern 203 may be formed to expose the nano-sized active region of the fifth transistor TR5. An ion implantation process with p-type impurities may be performed to the nano-sized active region of the fifth transistor TR5 exposed by the third mask pattern 203, thereby forming a homogeneously doped region OR. The homogeneously doped region OR of the fifth transistor TR5 may have substantially the same doping concentration as the homogeneously doped region OR of the second transistor TR2.

Figure 15A:
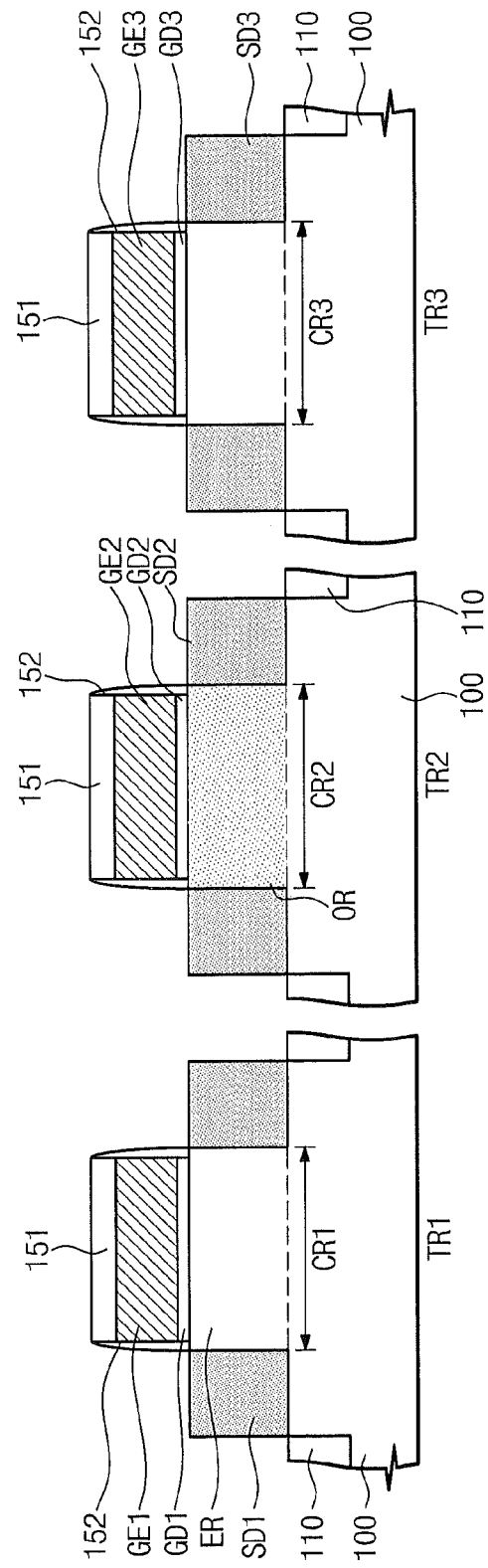
Figure 15B:
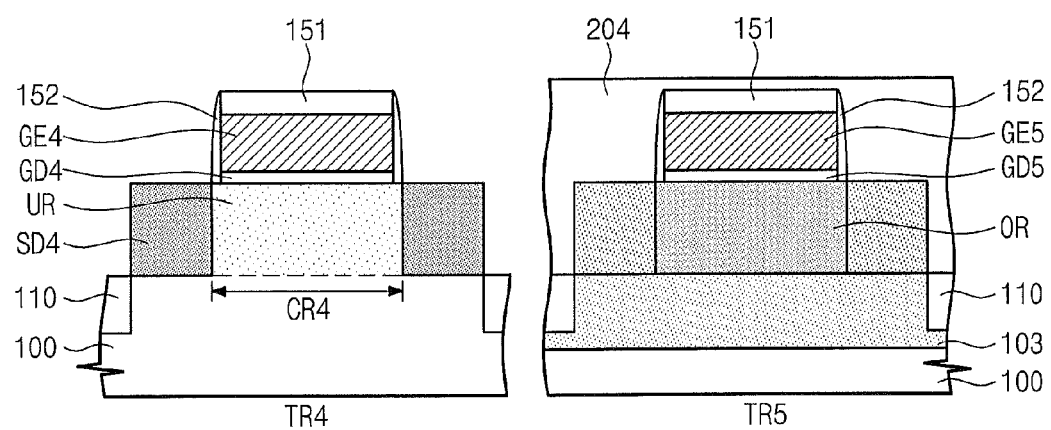

Referring to FIGS. 15A and 15B, the third mask pattern 203 may be removed, and then, gate dielectrics GD1-GD5 and gate electrodes GE1-GE5 of the first to fifth transistor TR1-TR5 may be sequentially formed. The gate dielectrics GD1-GD5 and the gate electrodes, GE1-GE5 may be formed by a chemical vapor deposition or a sputtering process. At least one of the gate dielectrics GD1-GD5 may include at least one material different from the others. In example embodiments, the gate electrodes GE1-GE5 may be simultaneously formed using the identical process, and thus, they may be formed of the same material. For example, the gate electrodes GE1-GE5 may include a metal material having the same work-function. Capping patterns 151 may be formed on the gate electrodes GE1-GE5, respectively, spacers may be formed on sidewalls of the gate electrodes GE1-GE5, and then, first to fourth S/D regions SD1-SD4 may be formed. The formation of the first to fourth S/D regions SD1-SD4 may include forming a fourth mask pattern 204 on the nano-sized active region of the fifth transistor TR5 and then performing an ion implantation process. As the result of the formation of the first to fourth S/D regions SD1-SD4, first to fourth channel forming regions CR1-CR4 may be defined in the first to fourth transistors TR1-TR4, respectively. The first channel forming region CR1 may include a heterogeneously doped p-type region ER having a conductivity type different from the first S/D regions SD1. The second channel forming region CR2 may include the homogeneously doped n-type region OR having the same conductivity type as the second S/D regions SD2. The fourth channel forming region CR4 may include the undoped region UR. In the present embodiment, the first to fourth S/D regions SD1-SD4 may have substantially the same doping concentration as each other, but example embodiments of the inventive concepts may not be limited thereto.

Figure 16A:
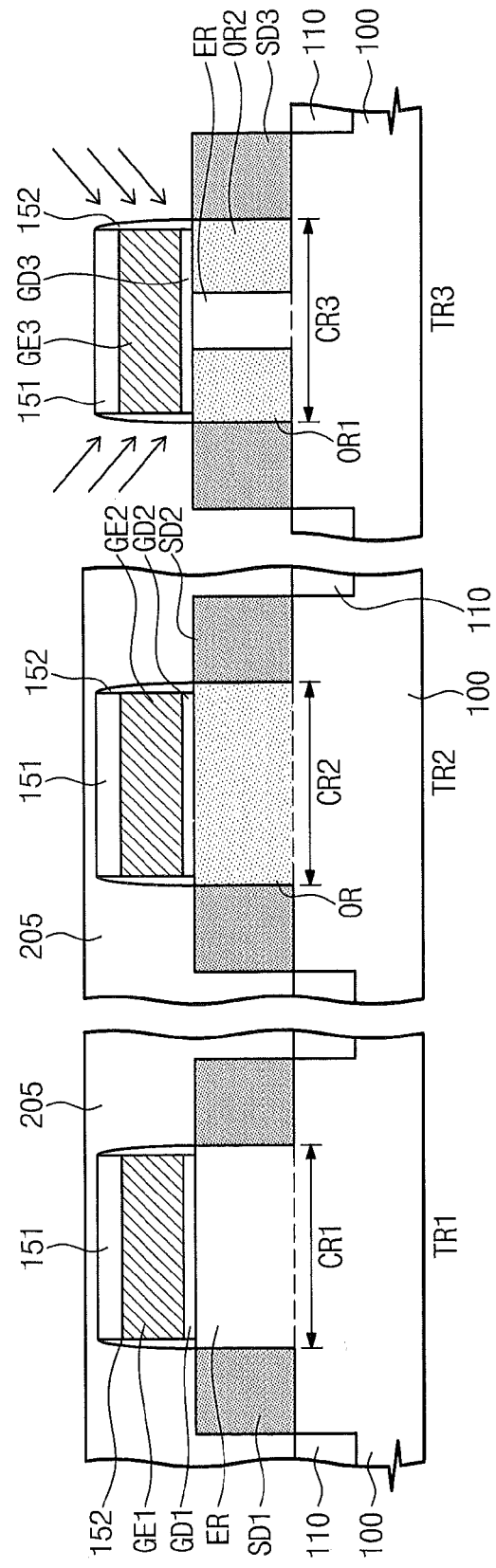
Figure 16B:
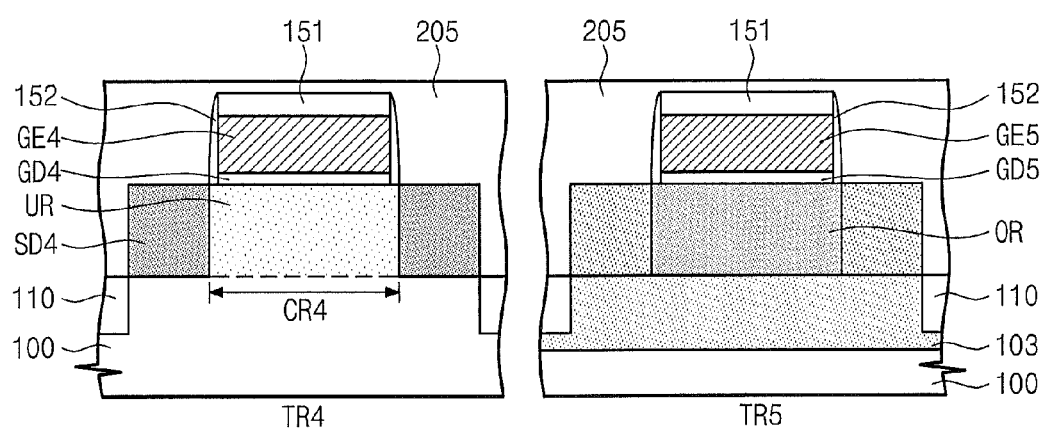

Referring to FIGS. 16A and 16B, the fourth mask pattern 204 may be removed, and then, a fifth mask pattern 205 may be formed to cover the first, second, fourth, and fifth transistors TR1, TR2, TR4, and TR5. First and second homogeneously doped regions OR1 and OR2 may be formed in the third transistor TR3 using the fifth mask pattern 205 as an ion injection mask. In example embodiments, the first and second homogeneously doped regions OR1 and OR2 may be formed by a tilted ion implantation process, in which the fifth mask pattern 205, the capping pattern 151, and the spacer 152 are used as ion injection masks. As a result, the third channel forming region CR3 may include the first and second homogeneously doped regions OR1 and OR2 and the heterogeneously doped region ER interposed therebetween.

Figure 17A:
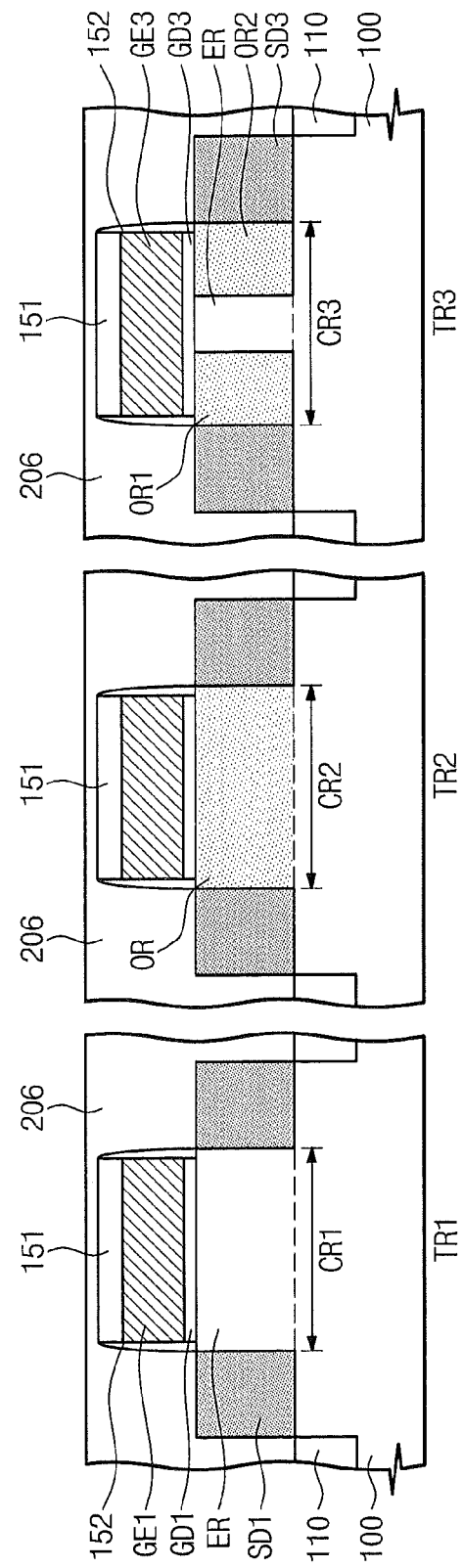
Figure 17B:
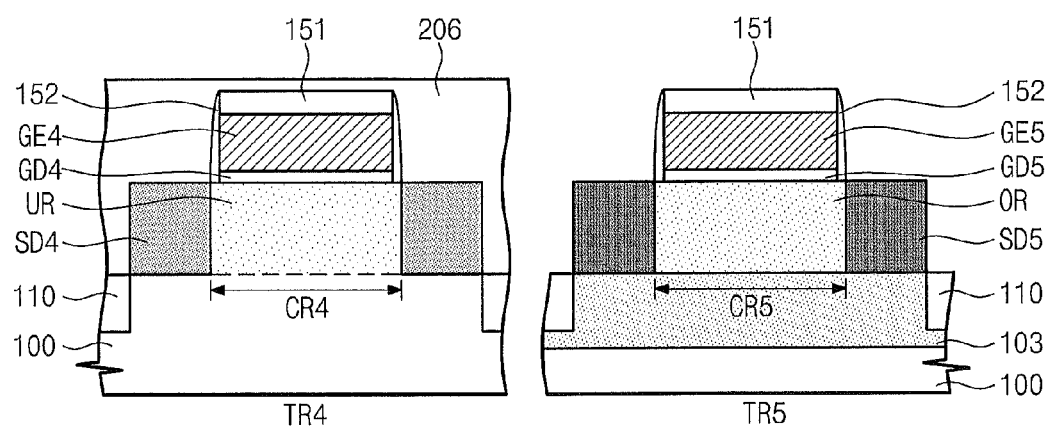

Referring to FIGS. 17A and 17B, the fifth mask pattern 205 may be removed, and then, a sixth mask pattern 206 may be formed to cover the first to fourth transistors TR1-TR4. Fifth S/D regions SD5 may be formed in the fifth transistor TR5 exposed by the sixth mask pattern 206. Accordingly, a fifth channel forming region CR5 may be defined between the fifth S/D regions SD5. In example embodiments, the fifth S/D regions SD5 may be p-type and have a doping concentration that is higher than the homogeneously doped region OR of the fifth transistor TR5. However, example embodiments of the inventive concepts may not be limited thereto.

Figure 18A:
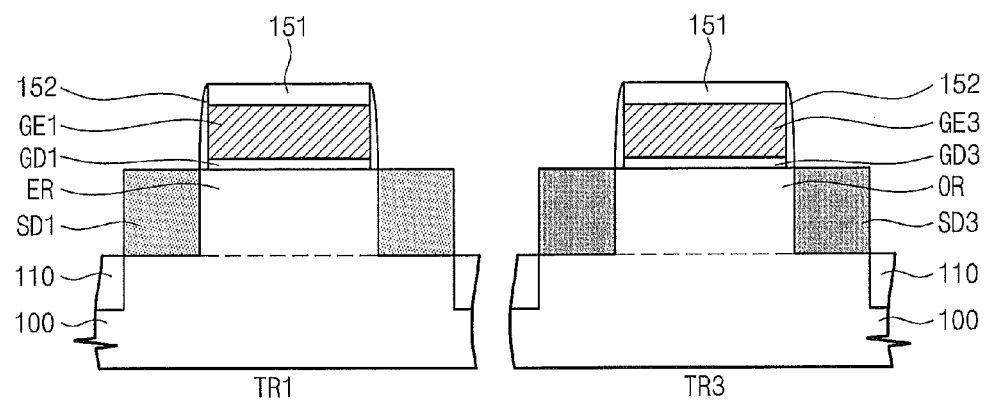
FIGS. 18A through 18C are sectional views illustrating a method of fabricating a semiconductor device according to other example embodiments of the inventive concepts.
Figure 18B:
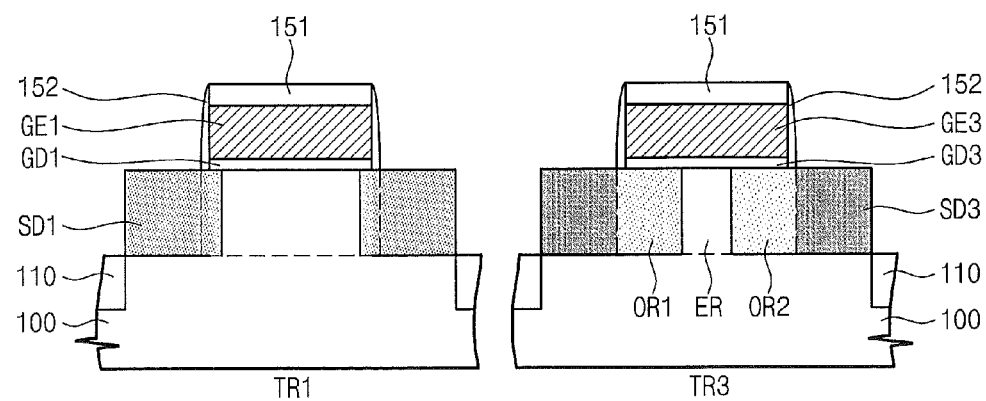
Figure 18C:
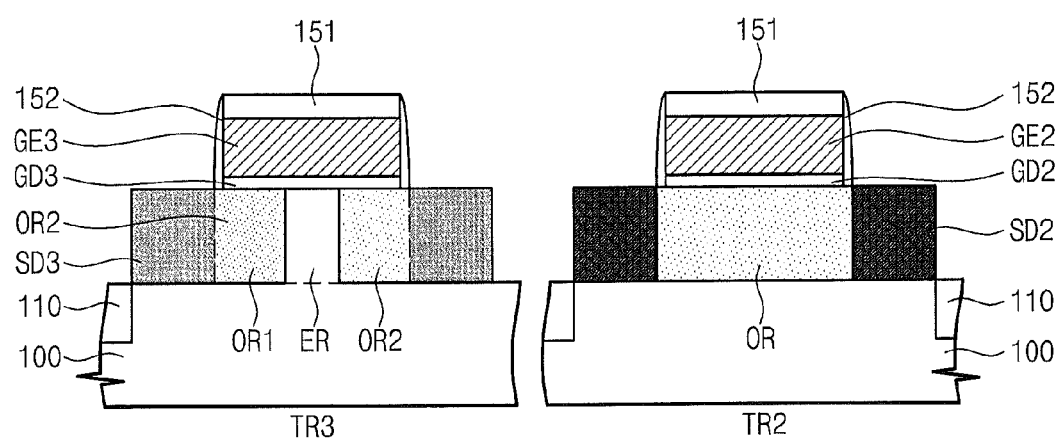

A method of fabricating a semiconductor device according to other example embodiments of the inventive concepts will be described with reference to FIGS. 18A through 18C. FIG. 18A shows an initial stage of the first and third transistors TR1 and TR3, in which the third S/D region SD3 is doped to have a higher concentration than the first S/D region SD1. FIG. 18B shows a post annealing stage of the first and third transistors TR1 and TR3 after a thermal diffusion process. The third S/D regions SD3 may have a relatively high concentration compared with the second S/D regions SD2, and thus, as shown, a diffusion distance of dopants may be longer for the third S/D regions SD3 than for the second S/D regions SD2. As a result, the third transistor TR3 may include the first and second homogeneously doped regions OR1 and OR2 adjacent to the third S/D regions SD3 and the heterogeneously doped region ER interposed between the first and second homogeneously doped regions OR1 and OR2. In example embodiments, the first and second homogeneously doped regions OR1 and OR2 may have a doping concentration continuously decreasing from the third S/D regions SD3 to the heterogeneously doped region ER.

Similarly, the channel forming regions of the second and third transistors TR2 and TR3 may be formed by the thermal diffusion process. For example, as shown in FIG. 18C, the second S/D regions SD2 of the second transistor TR2 may be doped to have a higher concentration than the third S/D regions SD3 of the third transistor TR3. Thereafter, if the thermal diffusion is performed, dopants may be diffused inward from the second S/D regions SD2 of the second transistor TR2, thereby forming the homogeneously doped region OR connecting the second S/D regions SD2 to each other.

In still other embodiments, a tilted ion implantation process may be performed in conjunction with the thermal diffusion process for forming the channel forming regions.

[Embodiments for Non-Fin Shaped Active Region]

Figure 19:
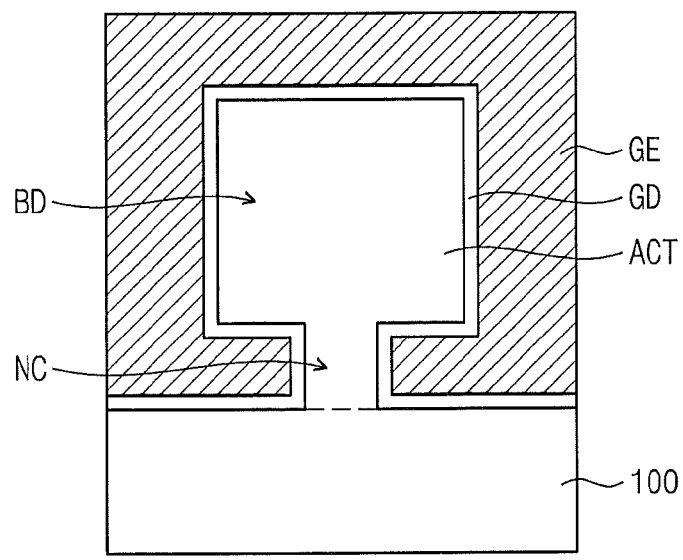
FIG. 19 is a schematic diagram illustrating a nano-sized active region of a semiconductor device according to other example embodiments of the inventive concepts.

The nano-sized active region of the transistor was depicted to have a fin-shaped structure, but is variously modified to have other structures. FIG. 19 is a schematic diagram illustrating a nano-sized active region of a semiconductor device according to other example embodiments of the inventive concepts. In the present embodiment, each of the nano-sized active regions ACT of the first to fifth transistors may include a neck portion NC adjacent to the substrate 100 and a body portion BD that is wider than the neck portion NC, thereby having an omega-shaped section. A gate dielectric GD and a gate electrode GE may be sequentially provided on the nano-sized active regions ACT. The gate electrode GE may include a portion extending below the nano-sized active region ACT.

Figure 20:
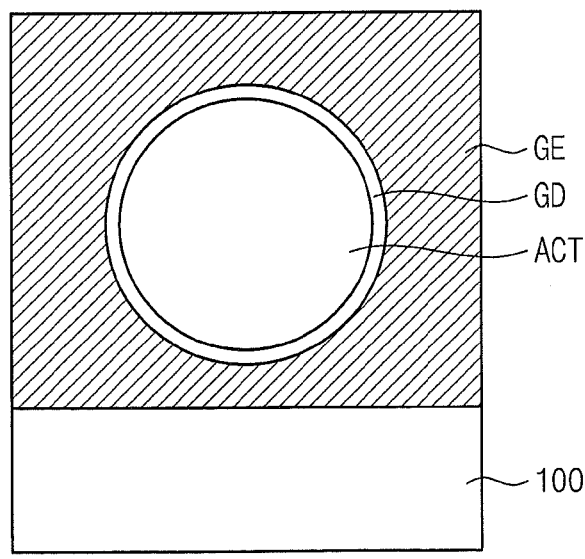
FIG. 20 is a schematic diagram illustrating a nano-sized active region of a semiconductor device according to still other example embodiments of the inventive concepts.

FIG. 20 is a schematic diagram illustrating a nano-sized active region of a semiconductor device according to still other example embodiments of the inventive concepts. In the present embodiment, at least one of the first to fifth transistors may include a nanowire-shaped nano-sized active region ACT, which may be spaced apart from the substrate 100. A gate dielectric GD and a gate electrode GE may be provided on the nano-sized active region ACT. The gate electrode GE may extend between the nano-sized active region ACT and the substrate 100.

Figure 21:
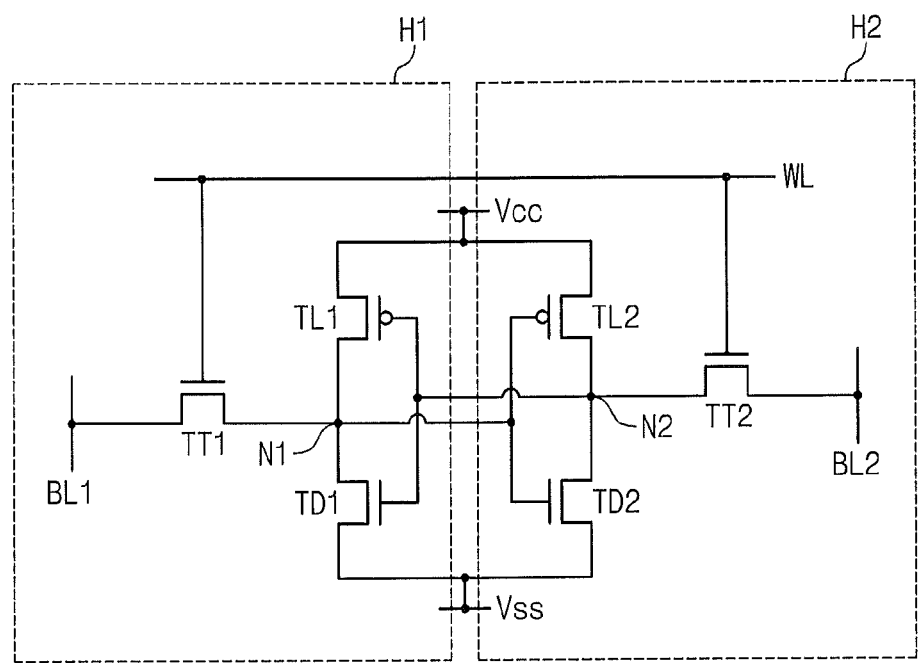
FIG. 21 is an equivalent circuit diagram of a CMOS SRAM cell including a fin field effect transistor according to example embodiments of the inventive concepts.

FIG. 21 is an equivalent circuit diagram of a CMOS SRAM cell, in which the fin field effect transistor according to example embodiments of the inventive concepts is provided. Referring to FIG. 21, the CMOS SRAM cell may include a pair of driver transistors TD1 and TD2, a pair of transfer transistors TT1 and TT2, and a pair of load transistors TL1 and TL2. The driver transistors TD1 and TD2 may be pull-down transistors, the transfer transistors TT1 and TT2 may be pass transistors, and the load transistors TL1 and TL2 may be pull-up transistors. The driver transistors TD1 and TD2 and the transfer transistors TT1 and TT2 may be NMOS transistors, and the load transistors TL1 and TL2 may be PMOS transistors.

The first driver transistor TD1 and the first transfer transistor TT1 may be connected in series to each other. A source region of the first driver transistor TD1 may be electrically connected to a ground line Vss, and a drain region of the first transfer transistor TT1 may be electrically connected to a first bit line BL1. The second driver transistor TD2 and the second transfer transistor TT2 may be connected in series to each other. A source region of the second driver transistor TD2 may be electrically connected to the ground line Vss, and a drain region of the second transfer transistor TT2 may be electrically connected to a second bit line BL2.

Source and drain regions of the first load transistor TL1 may be electrically connected to a power line Vcc and a drain region of the first driver transistor TD1, respectively. Source and drain regions of the second load transistor TL2 may be electrically connected to the power line Vcc and a drain region of the second driver transistor TD2, respectively. The drain region of the first load transistor TL1, the drain region of the first driver transistor TD1, and a source region of the first transfer transistor TT1 may serve as a first node N1. The drain region of the second load transistor TL2, the drain region of the second driver transistor TD1, and a source region of the second transfer transistor TT2 may serve as a second node N2. Gate electrodes of the first driver transistor TD1 and the first load transistor TL1 may be electrically connected to the second node N2, and gate electrodes of the second driver transistor TD2 and the second load transistor TL2 may be electrically connected to the first node N1. Gate electrodes of the first and second transfer transistors TT1 and TT2 may be electrically connected to a word line WL. The first driver transistor TD1, the first transfer transistor TT1, and the first load transistor TL1 may constitute a first half cell H1, while the second driver transistor TD2, the second transfer transistor TT2, and the second load transistor TL2 may constitute a second half cell H2.

At least one the transistors according to example embodiments of the inventive concepts may be used to realize at least one of the driver transistors TD1 and TD2, the transfer transistors TT1 and TT2, or the load transistors TL1 and TL2. For example, the driver transistors TD1 and TD2 may be configured to have the technical features of the first transistor according to example embodiments of the inventive concepts, and the transfer transistors TT1 and TT2 may be configured to have the technical features of the second transistor according to example embodiments of the inventive concepts. In other embodiments, the first driver transistor TD1, the second driver transistor TD2, the first transfer transistor TT1, the second transfer transistor TT2 may be configured to have the technical features of the first to fourth transistors, respectively, according to example embodiments of the inventive concepts, while the load transistors TL1 and TL2 may be configured to have the technical features of the fifth transistor according to example embodiments of the inventive concepts. In the case where plural ones of the transistors are provided in the form of the transistors according to example embodiments of the inventive concepts, structural features (e.g., a width and a height of each fin portion, the number of fin portions, a position and a shape of a semiconductor layer) of each transistor may be variously modified within the scope of the inventive concepts. Further, example embodiments of the inventive concepts may not be limited to the example of SRAM, and they may be applied or modified to realize a logic device, DRAM, MRAM, other semiconductor devices, and fabricating methods thereof.

Figure 22:
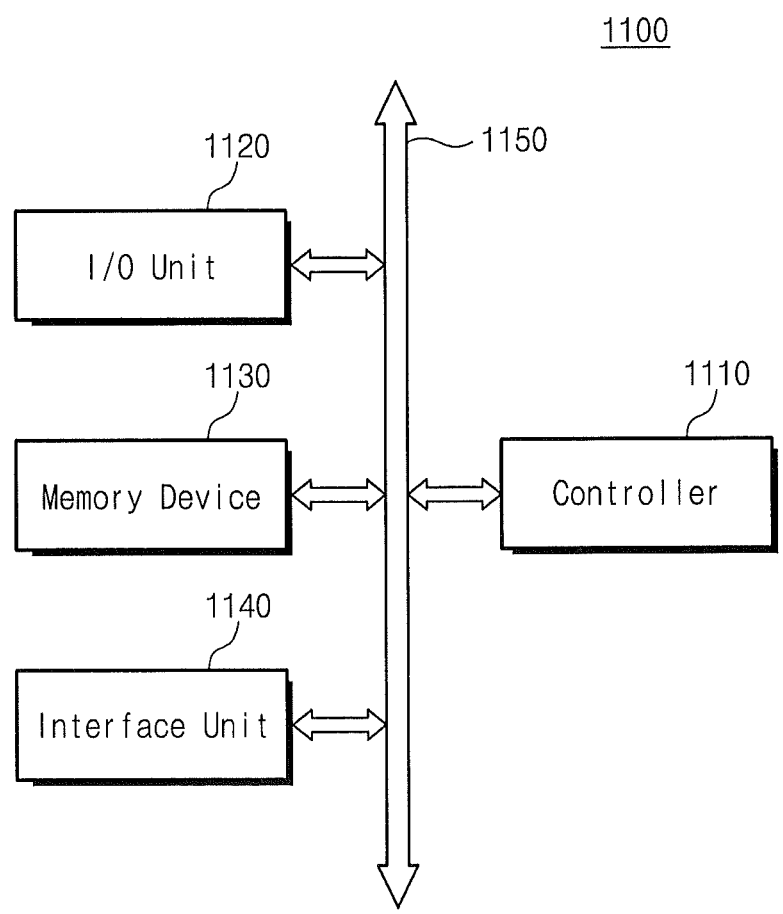
FIG. 22 is a block diagram of an electronic system including a semiconductor device according to example embodiments of the inventive concepts.

FIG. 22 is a block diagram of an electronic system including a semiconductor device according to example embodiments of the inventive concepts.

Referring to FIG. 22, an electronic system 1100 according to example embodiments of the inventive concepts may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include a microprocessor, a digital signal processor, a microcontroller and/or another logic device. The other logic device may have a similar function to the microprocessor, the digital signal processor and/or the microcontroller. The I/O unit 1120 may include a keypad, a keyboard and/or a display unit. The memory device 1130 may store data and/or commands. The memory device 1130 may further include another type of data storing devices, which are different from the data storing devices described above. The interface unit 1140 may transmit electrical data to a communication network and/or may receive electrical data from a communication network. The interface unit 1140 may operate by wireless and/or cable. For example, the interface unit 1140 may include an antenna for wireless communication and/or a transceiver for cable communication. Although not shown in the drawings, the electronic system 1100 may further include a fast DRAM device and/or a fast SRAM device that acts as a cache memory for the controller 1110. The field effect transistor according to example embodiments of the inventive concepts may be provided in the memory device 1130 or serve as components of the controller 1110, the interface unit 1140 and/or the I/O unit 1120.

The electronic system 1100 may be applied to a personal digital assistant (PDA), a portable computer, a web tablet, a wireless phone, a mobile phone, a digital music player, a memory card and/or an electronic product. The electronic product may receive and/or transmit information data by wireless.

According to example embodiments of the inventive concepts, it is possible to realize a semiconductor device including transistors having several threshold voltages different from each other.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a first transistor and a second transistor integrated on a substrate, each of the first and second transistors comprising a nano-sized active region including source and drain regions in respective end portions of the nano-sized active region and a channel forming region between the source and drain regions,
wherein the source and drain regions of the first transistor have the same conductivity type as those of the second transistor,
the second transistor has a threshold voltage lower than that of the first transistor, and
the channel forming region of the second transistor comprises a homogeneously doped region, whose conductivity type is the same as the source and drain regions of the second transistor and is different from the channel forming region of the first transistor.

2. The device of claim 1, wherein during an operation of the semiconductor device, carriers having the same conductivity type as minority carriers of the source and drain regions of the second transistor are accumulated in the homogeneously doped region of the second transistor to form an inversion region.

3. The device of claim 2, wherein the second transistor is turned off due to the presence of the inversion region.

4. The device of claim 2, wherein a depth of the inversion region from a surface of the nano-sized active region protruding from the substrate is substantially the same as those of the source and drain regions of the second transistor.

5. The device of claim 1, wherein a doping concentration of the homogeneously doped region is lower than those of the source and drain regions of the second transistor.

6. The device of claim 5, wherein the doping concentration of the homogeneously doped region decreases with increasing distance from the source and drain regions of the second transistor.

7. The device of claim 1, wherein the homogeneously doped region connects the source and drain regions of the second transistor to each other.

8. The device of claim 7, further comprising a third transistor including source and drain regions, whose conductivity type is the same as those of the source and drain regions of the first transistor, and a channel forming region between the source and drain regions,
wherein the channel forming region of the third transistor comprises:
a first homogeneously doped region connected to the source region of the third transistor;
a second homogeneously doped region connected to the drain region of the third transistor; and
a heterogeneously doped region connecting the first homogeneously doped region with the second homogeneously doped region, wherein the first and second homogeneously doped regions have the same conductivity type as the source and drain regions of the third transistor, and the heterogeneously doped region has a different conductivity type from the source and drain regions of the third transistor.

9. The device of claim 8, wherein a threshold voltage of the third transistor is lower than that of the first transistor and higher than that of the second transistor.

10. The device of claim 8, wherein the threshold voltage of the third transistor decreases with decreasing width of the heterogeneously doped region and increases with increasing width of the heterogeneously doped region.

11. The device of claim 8, wherein a doping concentration of the first homogeneously doped region decreases with increasing distance from the source region of the third transistor, and a doping concentration of the second homogeneously doped region decreases with increasing distance from the drain region of the third transistor.

12. The device of claim 8, wherein during an operation of the semiconductor device, the third transistor is turned-off by an inversion region in the first and second homogeneously doped regions and is turned-on by an inversion region in the heterogeneously doped region.

13. The device of claim 1, wherein the homogeneously doped region comprises a first homogeneously doped region adjacent to the source region of the second transistor and a second homogeneously doped region adjacent to the drain region of the second transistor, and the channel forming region of the second transistor further comprises a heterogeneously doped region connecting the first homogeneously doped region with the second homogeneously doped region.

14. The device of claim 13, wherein doping concentrations of the first and second homogeneously doped regions are lower than those of the source and drain regions of the second transistor.

15. The device of claim 13, wherein a doping concentration of the first homogeneously doped region decreases from the source region of the second transistor to the heterogeneously doped region, and a doping concentration of the second homogeneously doped region decreases from the drain region of the second transistor to the heterogeneously doped region.

16. The device of claim 1, further comprising a fourth transistor including source and drain regions, whose conductivity type is the same as those of the source and drain regions of the first transistor, and a channel forming region between the source and drain regions, wherein the channel forming region of the fourth transistor is in a substantially undoped state.

17. The device of claim 16, wherein a threshold voltage of the fourth transistor is lower than that of the first transistor and higher than that of the second transistor.

18. The device of claim 1, further comprising device isolation layers on the substrate, wherein the nano-sized active region extends from the substrate to between the device isolation layers, thereby having a fin-shaped structure.

19. The device of claim 18, wherein the fin-shaped nano-sized active region has a width of about 10 nm or less.

20. The device of claim 1, wherein each of the first and second transistors further comprises a gate dielectric and a gate electrode that are sequentially stacked on the nano-sized active region, and the gate electrode comprises a portion extending below the nano-sized active region.

21. The device of claim 1, wherein the semiconductor device further comprises a fifth transistor, and the fifth transistor comprises source and drain regions having a different conductivity type from the source and drain regions of the first transistor and a channel forming region provided between the source and drain regions, and the channel forming region of the fifth transistor comprises a homogeneously doped region having the same conductivity type as those of the source and drain regions of the fifth transistor.

22. The device of claim 21, wherein each of the first and fifth transistors comprises a gate electrode, and the gate electrodes of the first and fifth transistors include the same metal material as each other.

23. The device of claim 21, wherein each of the first and fifth transistors comprises a gate electrode, and the gate electrode of the first transistor has the same work-function as that of the fifth transistor.

* * * * *